United States Patent [19]
Sansbury et al.

[11] Patent Number: 6,028,787
[45] Date of Patent: *Feb. 22, 2000

[54] NONVOLATILE STATIC MEMORY CIRCUIT

[75] Inventors: James D. Sansbury, Portola Valley; Raminda U. Madurawe, Sunnyvale, both of Calif.

[73] Assignee: Altera Corporation, San Jose, Calif.

[*] Notice: This patent is subject to a terminal disclaimer.

[21] Appl. No.: 09/085,126

[22] Filed: May 27, 1998

Related U.S. Application Data

[63] Continuation of application No. 08/701,416, Aug. 22, 1996, Pat. No. 5,812,450, which is a continuation-in-part of application No. 08/516,061, Aug. 17, 1995, Pat. No. 5,581,501.

[51] Int. Cl.[7] .................................................. G11C 16/00
[52] U.S. Cl. ............... 365/185.01; 365/154; 365/185.07; 365/185.08; 365/156
[58] Field of Search .......................... 365/185.01, 185.08, 365/156, 154, 185.07

[56] References Cited

U.S. PATENT DOCUMENTS

| | | | |
|---|---|---|---|
| 4,132,904 | 1/1979 | Harari | 307/238 |
| 4,596,938 | 6/1986 | Cartwright, Jr. | 307/279 |
| 4,651,303 | 3/1987 | Dias et al. | 365/185 |
| 4,652,773 | 3/1987 | Cartwright, Jr. | 307/469 |
| 4,829,203 | 5/1989 | Ashmore, Jr. | 307/469 |
| 4,924,119 | 5/1990 | Lee | 307/469 |
| 5,043,946 | 8/1991 | Yamauchi et al. | 365/228 |
| 5,140,552 | 8/1992 | Yamauchi et al. | 365/185 |
| 5,181,188 | 1/1993 | Yamauchi et al. | 365/228 |
| 5,200,652 | 4/1993 | Lee | 307/465 |
| 5,262,986 | 11/1993 | Yamauchi | 365/185 |
| 5,272,368 | 12/1993 | Turner et al. | 257/315 |
| 5,283,759 | 2/1994 | Smith | 365/185 |
| 5,299,156 | 3/1994 | Jiang et al. | 365/156 |
| 5,495,437 | 2/1996 | Tai et al. | 365/156 |
| 5,581,501 | 12/1996 | Sansbury et al. | 365/185.01 |
| 5,602,776 | 2/1997 | Herdt et al. | 365/185.08 |
| 5,812,450 | 9/1998 | Sansbury et al. | 365/185.01 |

FOREIGN PATENT DOCUMENTS

| | | | |
|---|---|---|---|
| 0 066980 A1 | 12/1982 | European Pat. Off. | H01L 27/12 |
| 0 431 911 A2 | 6/1991 | European Pat. Off. | G11C 16/04 |
| 2 128 435 | 4/1984 | United Kingdom | H03K 17/687 |

*Primary Examiner*—Tan T. Nguyen
*Attorney, Agent, or Firm*—Townsend and Townsend and Crew LLP

[57] ABSTRACT

A memory cell (400) for storing data on an integrated circuit. The memory cell (400) is static, nonvolatile, and reprogrammable. The layout of the memory cell is compact. In a first state, the logic output from this memory cell (400) is at about voltage level at a first conductor (505); and in a second state, the logic output is at about a voltage level at a second conductor (510). The memory cell (400) of the present invention includes a first programmable memory element (515) and a second programmable memory element (520). First programmable memory element (515) is coupled between the first conductor (505) and a sensing node (405). Second programmable memory element (520) is coupled between the sensing node (405) and the second conductor (510). In the first state, first programmable memory element (515) is not programmed, while the second programmable memory element (520) is programmed. In the second state, first programmable memory element (515) is programmed, while second programmable memory element (520) is not programmed.

23 Claims, 10 Drawing Sheets

NONVOLATILE STATIC MEMORY CIRCUIT

This a continuation of patent application Ser. No. 08/701,416, filed Aug. 22, 1996 now U.S. Pat. No. 5,812,450, which is a continuation-in-part of patent application Ser. No. 08/516,061, filed Aug. 17, 1995, now U.S. Pat. No. 5,581,501, both of which are incorporated herein by reference for all purposes.

BACKGROUND OF THE INVENTION

The present invention relates to the field of integrated circuit memory technology. More specifically, the present invention provides an enhanced static memory cell for storing data.

Memory cells are used in the implementation of many types of electronic devices and integrated circuits. These devices include microprocessors, static random access memories (SRAMs), erasable-programmable read only memories (EPROMs), electrically erasable programmable read only memories (EEPROMs), Flash EEPROM memories, programmable logic devices (PLDs), field programmable gate arrays (FPGAs), application specific integrated circuits (ASICs), among others. Memory cells are used to store the data and other information for these and other integrated circuits.

As integrated circuit technology and semiconductor processing continue to advance, there is a need for greater densities and functionality in integrated circuits, which are often determined in a large part by the size of the memory cells. Further, it is desirable that the memory cells have improved operating characteristics, such as lower power consumption, nonvolatility, greater device longevity, improved data retention, better transient performance, superior voltage and current attributes, and improvements in other similar attributes.

Furthermore, improved memory cells are especially needed for particular applications, such as PLD integrated circuits. PLDs are well known to those in the electronic art. Such programmable logic devices are commonly referred as PALs (Programmable Array Logic), PLAs (Programmable Logic Arrays), FPLAs, PLDs, EPLDs (Erasable Programmable Logic Devices), EEPLDs (Electrically Erasable Programmable Logic Devices), LCAs (Logic Cell Arrays), FPGAs (Field Programmable Gate Arrays), and the like. Such devices are used in a wide array of applications where it is desirable to program standard, off-the-shelf devices for a specific application. Such devices include, for example, the well-known, Classic™, and MAX® 5000, and FLEX® 8000 EPLDs made by Altera Corp.

PLDs are generally known in which many logic array blocks (LABs) are provided in a two-dimensional array. LABs contain a number of individual programmable logic elements (LEs) which provide relatively elementary logic functions such as NAND, NOR, and exclusive OR. Further, PLDs have an array of intersecting signal conductors for programmably selecting and conducting logic signals to, from, and between the LABs and LEs. The configuration of the LABs, LEs, and interconnections between these logical elements is stored in memory cells. Memory cells may be used to programmably control the composition, configuration, and arrangements of logic array blocks (LABs) and logic elements (LEs) and also the interconnections between these logic array blocks and logic elements.

Resulting from the continued scaling and shrinking of semiconductor device geometries which are used to form integrated circuits (also known as "chips"), integrated circuits have progressively become smaller and denser. For programmable logic, it becomes possible to put greater numbers of programmable logic elements onto one integrated circuit. Furthermore, as the number of elements increases, it becomes increasingly important to improve the techniques and architectures used for interconnecting the elements and routing signals between the logic blocks. Also as PLDs increase in size and complexity, greater numbers of memory cells are required on to hold the configuration information of the logical elements.

While such devices have met with substantial success, such devices also meet with certain limitations, especially in situations in which the provision of more complex logic modules and additional or alternative types of interconnections between the logic modules would have benefits sufficient to justify the additional circuitry and programming complexity. There is also a continuing demand for logic devices with larger capacity. This produces a need to implement logic functions more efficiently and to make better use of the portion of the device which is devoted to interconnecting individual logic modules. Moreover, there is a need to more efficiently and effectively store the configuration information of PLDs. The memory technology used to store the configuration information of the PLD should be compact, power efficient, reprogrammable and nonvolatile, require little additional programming circuitry overhead, and generally provide enhancements to the performance and features of PLD logic modules and interconnections.

As can be seen, an improved memory cell is needed, especially an improved memory cell for storing the configuration information for the logic elements and interconnections of a programmable logic device.

SUMMARY OF THE INVENTION

The present invention provides a programmable memory cell for storing data in an integrated circuit. The memory cell may be used to store the configuration information of a programmable logic device. The memory cell is nonvolatile and reprogrammable. Furthermore, the layout of the memory cell is compact. Also, in a first state, a logic output from this memory cell is at a voltage level at a first conductor, which may be about VDD; and in a second state, a logic output is at a voltage level at a second conductor, which may be about VSS. Consequently, since the output swing of the memory cell may be rail-to-rail, a sense amplifier is not needed at the output of the memory cell during normal operation. The memory cell also has substantially zero static power consumption.

The memory cell of the present invention includes a first programmable memory element and a second programmable memory element. The first programmable memory element is of a similar device type as the second programmable memory element. In the first state, the first programmable memory element is programmed, while the second programmable memory element is erased. In the second state, the first programmable memory element is erased, while second programmable memory element programmed.

Specifically, the present invention comprises a memory cell having a stack of two MOS transistors, and various arrangements for arrays of such cells to successfully carry out erase, read, and write operations in an integrated circuit environment. The memory cell delivers full-rail power supply voltage at its output, without consuming DC power other than leakage currents. The memory cell of the present invention is both static (needing no refresh) and nonvolatile (retaining its memory if power is removed). It can be used as a standard RAM cell, where one bit or a string of bits may be read at a time; or as a configuration bit whose output drives multiplexers or other circuitry such as when used in programmable logic devices.

The two transistors comprising a memory cell are stacked in series between power supply rails. Both transistors are of the same type. For example, both transistors may be NMOS and programmable. In present processing technology, either Flash EEPROM or EEPROM transistors may be used to achieve RAM-type operation. IF ROM-type operation is desired, EPROM, fuse, or antifuse technology can be employed. The output node (or sensing node) is the connection between the two transistors. During a read operation, the gates of the transistors are held at a fixed (nonswitching) voltage. One of the two transistors of the cell is programmed to a high VT state such that it is off over the range of voltages which may be applied to its terminals. The other transistor is erased to a low VT state such that it is on over the range of voltages which may be applied to its terminal. The output of the cells is therefore one of the two rail voltages, depending on which of the two transistors is configured to a high VT, and which is configured to a low VT. The off transistor blocks DC current so that no DC power is consumed.

More specifically, the memory cell of the present invention includes: a first voltage conductor; a second voltage conductor; a sensing node; a first programmable memory element, coupled between the first voltage conductor and the sensing node; and a second programmable memory element, coupled between the sensing node and the second voltage conductor. Moreover, the second programmable memory element is independently programmable from the first programmable memory element. The first programmable memory element may be of the same device type as the second programmable memory element. A voltage level at the second voltage conductor may be below that at the first voltage conductor.

Other objects, features, and advantages of the present invention will become apparent upon consideration of the following detailed description and the accompanying drawings, in which like reference designations represent like features throughout the figures.

DETAILED DESCRIPTION

Figure 1:
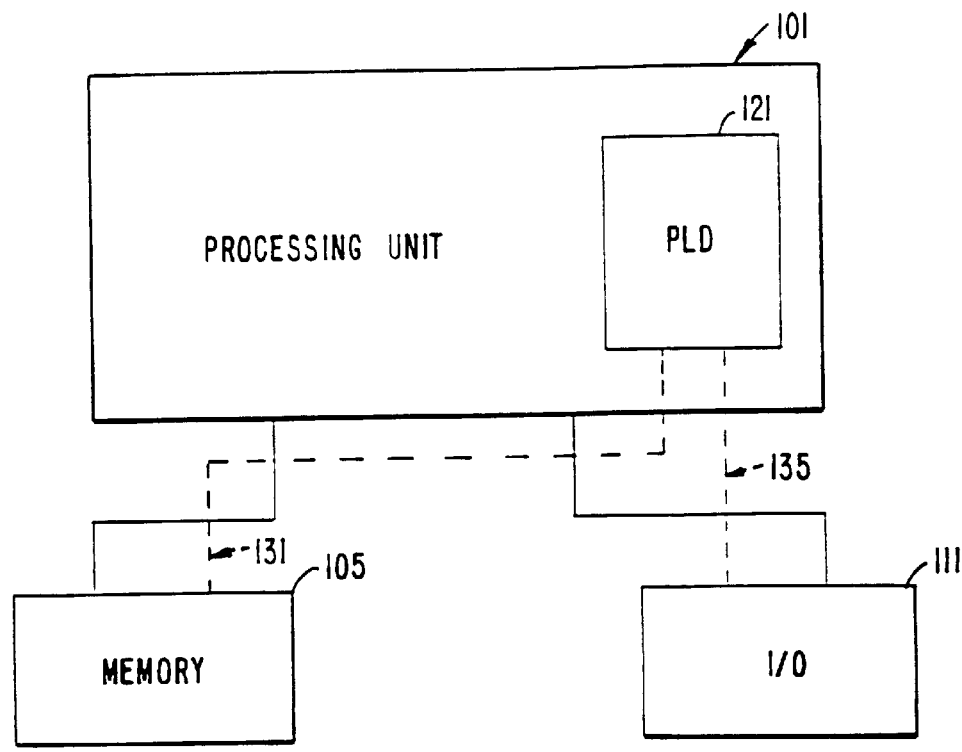
FIG. 1 is a block diagram of a digital system incorporating a programmable logic device integrated circuit.

FIG. 1 shows a block diagram of a digital system within which the present invention may be embodied. In the particular embodiment of FIG. 1, a processing unit 101 is coupled to a memory 105 and an I/O 111 and incorporates a programmable logic device (PLD) 121. PLD 121 may be specially coupled to memory 105 through connection 131 and to I/O 111 through connection 135. The system may be a programmed digital computer system, digital signal processing system, specialized digital switching network, or other processing system. Moreover, the system may be a general purpose computer, a special purpose computer (such as telecommunications equipment) optimized for an application-specific task such as programming PLD 121, or a combination of a general purpose computer and auxiliary special purpose hardware.

Processing unit 101 may direct data to an appropriate system component for processing or storage, execute a program stored in memory 105 or input using I/O 111, or other similar function. Processing unit 101 may be a central processing unit (CPU), microprocessor, floating point coprocessor, graphics coprocessor, hardware controller, microcontroller, programmable logic device programmed for use as a controller, or other processing unit. Furthermore, in many embodiments, there is often no need for a CPU. For example, instead of a CPU, one or more PLDs 121 may control the logical operations of the system.

In some embodiments, processing unit 101 may even be a computer system. In one embodiment, source code may be stored in memory 105, compiled into machine language, and executed by processing unit 101. Processing unit 101 need not contain a CPU and in one embodiment, instructions may be executed by one or more PLDs 121. Instead of storing source code in memory 105, only the machine language representation of the source code, without the source code, may be stored in memory 105 for execution by processing unit 101. Memory 105 may be a random access memory (RAM), read only memory (ROM), fixed or flexible disk media, PC Card flash disk memory, tape, or any other storage retrieval means, or any combination of these storage retrieval means.

Processing unit 101 uses I/O 111 to provide an input and output path for user interaction. For example, a user may input logical functions to be programmed into programmable logic device 121. I/O 111 may be a keyboard, mouse, track ball, digitizing tablet, text or graphical display, touch screen, pen tablet, printer, or other input or output means, or any combination of these means. In one embodiment, I/O 111 includes a printer used for printing a hard copy of any processing unit 101 output. In particular, using I/O 111, a user may print a copy of a document prepared using a word processing program executed using processing unit 101. In other cases, a user may print out a copy of the source code or a listing of the logical functions contained within PLD 121.

PLD 121 may serve many different purposes within the system in FIG. 1. PLD 121 may be a logical building block of processing unit 101, supporting its internal and external operations. PLD 121 is programmed to implement the logical functions necessary to carry on its particular role in system operation.

As some examples of the multitude of uses for PLD 121, processing unit 101 may use PLD 121, through connection 131, to decode memory or port addresses for accessing memory 105 or I/O 111. PLD 121 may be programmed to store data like a memory or specialized memory, where this comes from processing unit 101 or memory 105 (via connection 131). PLD 121 may be used as a microcontroller for a memory 105 device such as a fixed or flexible disk drive. PLD 121 may also be configured to be a microcontroller for an I/O 111 device such as a keyboard or scanner, passing data through connection 135.

In other embodiments, PLD 121 may be used as a controller or specialized processing unit such as a coprocessor for performing mathematical or graphical calculations. In still other embodiments, PLD 121 may be used for telecommunications applications. For example, processing unit 101 would direct data to PLD 121; PLD 121 processes this data; then PLD 121 returns the results to processing unit 101. Furthermore, processing unit 101 may pass or direct a program stored in memory 105 or input using I/O 111 to PLD 121 for execution. These are some of multitude of uses of PLD 121 within a digital system. Also, a system such as the one shown in FIG. 1 may embody a plurality of PLDs 121, each performing different system functions.

The system shown in FIG. 1 may also be used for programming PLD 121 with a particular logic pattern. A computer program for designing functions into a PLD may be stored in memory 105 and executed using processing unit 101. Then, a design characteristic which is to be programmed into PLD 121 is input via I/O 111 and processed by processing unit 101. In the end, processing unit 101 transfers and programs the design characteristic into PLD 121.

In FIG. 1, processing unit 101 is shown incorporating PLD 121. However, in other embodiments, PLD 121 may be external to processing unit 101, and a PLD interface may be coupled between processing unit 101 and PLD 121. The PLD interface would provide the proper adapters or sockets for interfacing PLD 121 to processing unit 101. Moreover, the PLD interface would provide the proper voltages and electrical characteristics for coupling PLD 121 to processing unit 101.

Figure 2:
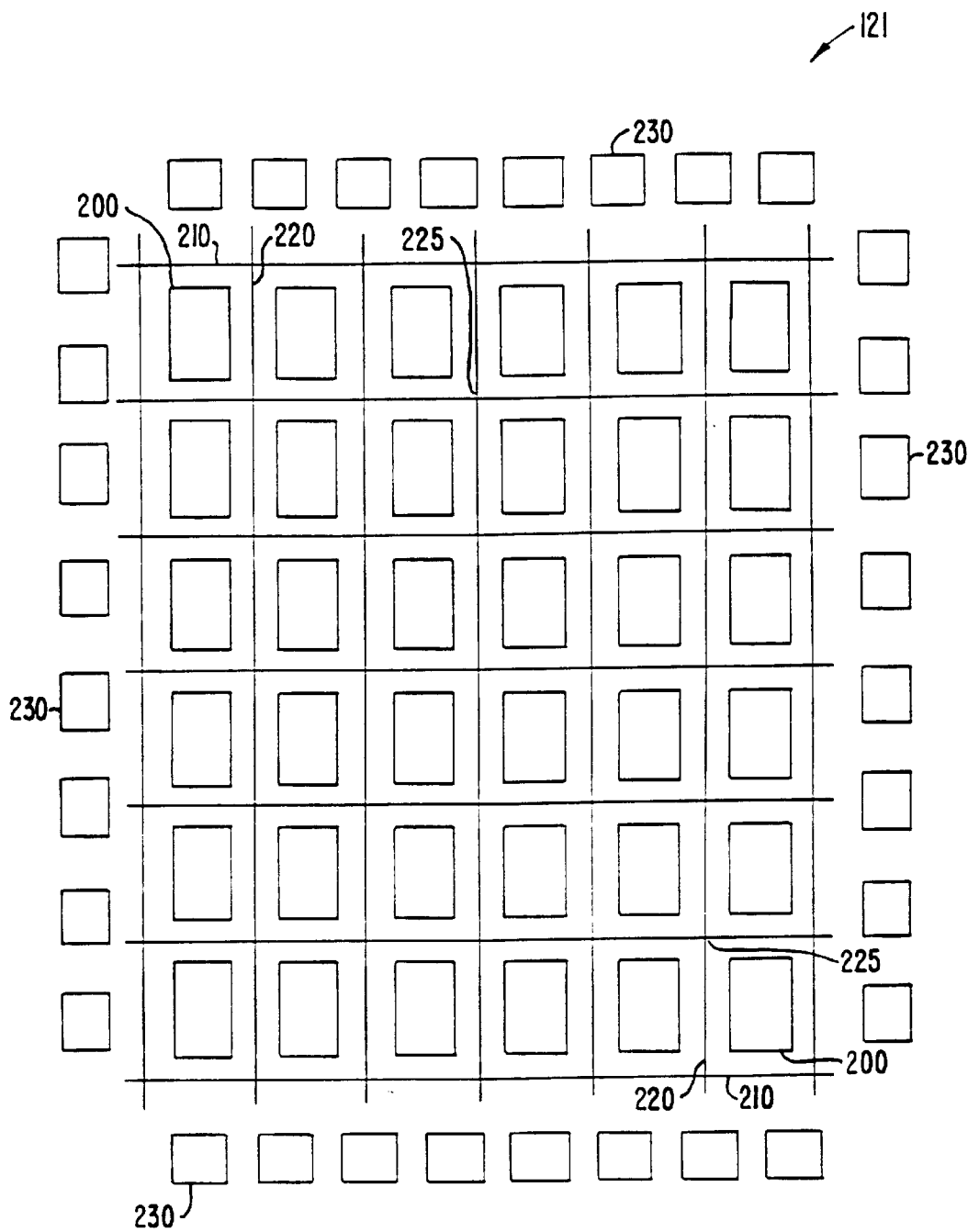
FIG. 2 is a block diagram showing the overall architecture of a programmable logic device.

FIG. 2 is a simplified block diagram of the overall internal architecture and organization of PLD 121 of FIG. 1. Many details of PLD architecture, organization, and circuit design are not necessary for an understanding of the present invention and such details are not shown in FIG. 2.

FIG. 2 shows a six-by-six two-dimensional array of thirty-six logic array blocks (LABs) 200. LAB 200 is a physically grouped set of logical resources that is configured or programmed to perform logical functions. The internal architecture of a LAB will be described in more detail below in connection with FIG. 3. PLDs may contain any arbitrary number of LABs, more or less than the PLD 121 shown in FIG. 2. Generally, in the future, as technology advances and improves, programmable logic devices with even greater numbers of logic array blocks will undoubtedly be created. Furthermore, LABs 200 need not be organized in a square matrix; for example, the array may be organized in a five-by-seven or a twenty-by-seventy matrix of LABs.

LAB 200 has inputs and outputs (not shown) which may or may not be programmably connected to a global interconnect structure, comprising an array of global horizontal interconnects (GHs) 210 and global vertical interconnects (GVs) 220. Although shown as single lines in FIG. 2, each GH 210 and GV 220 line represents a plurality of signal conductors. The inputs and outputs of LAB 200 are programmably connectable to an adjacent GH 210 and an adjacent GV 220. Utilizing GH 210 and GV 220 interconnects, multiple LABs 200 may be connected and combined to implement larger, more complex logic functions than can be realized using a single LAB 200.

In one embodiment, GH 210 and GV 220 conductors may or may not be programmably connectable at intersections 225 of these conductors. Moreover, GH 210 and GV 220 conductors may make multiple connections to other GH 210 and GV 220 conductors. Various GH 210 and GV 220 conductors may be programmably connected together to create a signal path from a LAB 200 at one location on PLD 121 to another LAB 200 at another location on PLD 121. Furthermore, an output signal from one LAB 200 can be directed into the inputs of one or more LABs 200. Also, using the global interconnect, signals from a LAB 200 can be fed back into the same LAB 200. In other embodiments or the present invention, only selected GH 210 conductors are programmably connectable to a selection of GV 220 conductors. Furthermore, in still further embodiments, GH 210 and GV 220 conductors may be specifically used for passing signal in a specific direction, such as input or output, but not both.

The PLD architecture in FIG. 2 further shows at the peripheries of the chip, input-output drivers 230. Input-output drivers 230 are for interfacing the PLD to external, off-chip circuitry. FIG. 2 shows thirty-two input-output drivers 230; however, a PLD may contain any number of input-output drivers, more or less than the number depicted. Each input-output driver 230 is configurable for use as an input driver, output driver, or bidirectional driver. An input driver takes signals from outside the chip and interfaces them to on-chip circuitry. An output drive takes internal signals and interfaces them to the outside world. A bidirectional driver performs the functions of both a input driver and an output driver. In addition, a bidirectional drive has a high-impedance mode which allows the driver to interface with a bidirectional bus. In other embodiments of the present invention, a PLD may have dedicated input drivers and dedicated output driver, as well as special "fast" input drivers and the like.

Like LABs 200, input-output drivers 230 are programmably connectable to adjacent GH 210 and GV 220 conductors. Using GH 210 and GV 220 conductors, input-output drivers 230 are programmably connectable to any LAB 200. Input-output drivers 230 facilitate the transfer of data between LABs 200 and external, off-chip circuitry. For example, off-chip logic signals from other chips may be coupled through input-output drivers 230 to drive one or more LABs 200. Based on these off-chip inputs and the logical functions programmed into LABs 200, LABs 200 will generate output signals that are coupled through the global interconnect to input-output drivers 230 for interfacing with off-chip circuitry.

Figure 3:
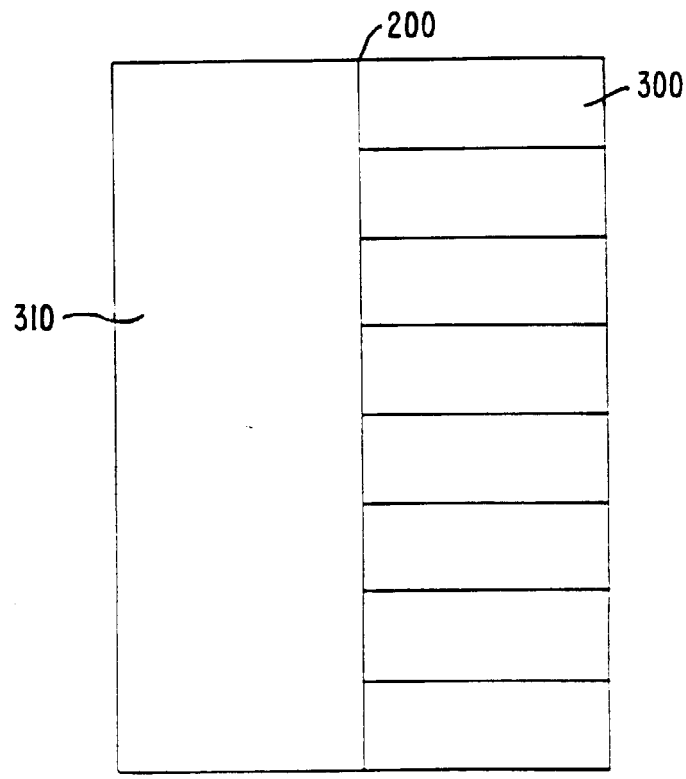
FIG. 3 is a simplified block diagram of a logic array block (LAB) of a programmable logic device.

FIG. 3 shows a simplified block diagram of LAB 200 of FIG. 2. LAB 200 is comprised of a varying number of logic elements (LEs) 300, sometimes referred to as "logic cells," and a local (or internal) interconnect structure 310. LAB 200 has eight LEs 300, but LAB 200 may have any number of LEs, more or less than eight. In a further embodiment of the present invention, LAB 200 has two "banks" of eight LEs for a total of sixteen LEs, where each bank has separate inputs, outputs, control signals, and carry chains.

A general overview of LE 300 is presented here, sufficient to provide a basic understanding of the present invention. LE 300 is the smallest logical building block of a PLD. Signals external to the LAB, such as from GHs 210 and GVs 220, are programmably connected to LE 300 through local interconnect structure 310, although LE 300 may be implemented in many architectures other than those shown in FIGS. 1–3. In one embodiment, LE 300 of the present invention incorporates a function generator that is configurable to provide a logical function of a number of variables, such a four-variable Boolean operation. As well as combinatorial functions, LE 300 also provides support for sequential and registered functions using, for example, D flip-flops.

LE 300 provides combinatorial and registered outputs that are connectable to the GHs 210 and GVs 220, outside LAB 200. Furthermore, the outputs from LE 300 may be internally fed back into local interconnect structure 310; through local interconnect structure 310, an output from one LE 300 may be programmably connected to the inputs of other LEs 300, without using the global interconnect structure's GHs 210 and GVs 220. Local interconnect structure 310 allows short-distance interconnection of LES, without utilizing the limited global resources, GHs 210 and GVs 220. Through local interconnect structure 310 and local feedback, LEs 300 are programmably connectable to form larger, more complex logical functions than can be realized using a single LE 300. Furthermore, because of its reduced size and shorter length, local interconnect structure 310 has reduced parasitics compared to the global interconnection structure. Consequently, local interconnect structure 310 generally allows signals to propagate faster than through the global interconnect structure.

The memory cell of the present invention may be used in various places in a PLD. For example, the memory cell may be used to implement and store the configuration of a look-up table, function generator, programmable interconnect, and other components of the PLD. Using the memory cell of the present invention, a RAM may be constructed that will be used to implement the look-up tables used in LEs 300. The memory cell of the present invention may also be as a storage bit. This storage bit may be used, for example, to determine whether an LE is in registered or sequential mode. The storage bit may also be used to configure the operation of a programmable multiplexer.

Figure 4:
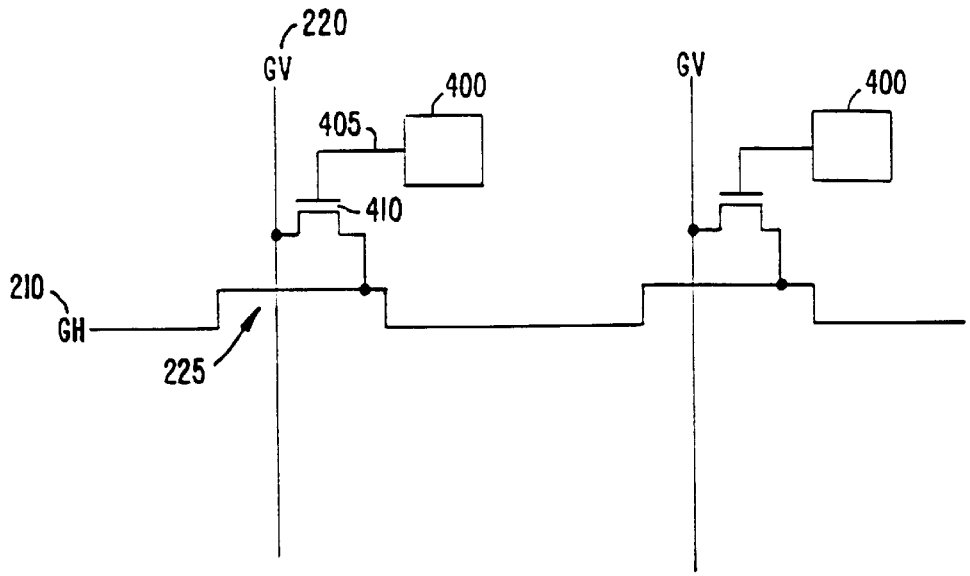
FIG. 4 is a diagram of the memory cell of the present invention used in the programmable interconnect of a programmable logic device.

FIG. 4 is a diagram showing an example of how the present invention may be used in the implementation of the programmable interconnection resources of a PLD, such as shown in FIG. 2. Memory cell 400 is a programmable memory cell of the present invention. Memory cell 400 stores a logic state, either a high or low logic state. Depending on the polarity of the logic, a logic high state may be a "one" while a logic low state may be a "zero."

Memory cell 400 is reprogrammable, which means that the cell may be programmed many times with new data. Furthermore, in the present invention, memory cell 400 is nonvolatile, which means that the stored information is retained even when power is removed. For example, after memory cell 400 is programmed with a particular logic state, memory cell 400 stores this information indefinitely until the cell is reprogrammed.

Memory cell 400 has an output or sensing node 405 for outputting its stored state. Sensing node 405 provides either a low level or a high level, representative of the state stored in memory cell 400. The voltage levels at sensing node 405 are typically full-rail voltages, about equal to either the VDD (sometimes referred to as VCC) or VSS of the integrated circuit. However, the full-rail voltages at sensing node 405 may also be different from the supply voltages of the integrated circuit. For example, an integrated circuit may have a VDD of 5 volts and a VSS at ground. Memory cell 400 may have "local" supply voltages of 3.3 volts and ground. Then, the output voltage levels at sensing node 405 will be about 3.3 volts and ground.

Memory cell 400 may be used to implement many types of logic elements and components. For example, memory cell 400 may be used to implement a flip-flop, register, storage bit, architecture bit, lookup table, programmable interconnect array, RAM, SRAM, ROM, EPROM, EEPROM, content-addressable memory (CAM), PLD, FPGA, PC Card memory card, and other similar memory elements and devices. For example, as shown in FIG. 4, memory cell 400 may be used to implement the programmable interconnection resources of a PLD.

In FIG. 4, GH 210 and GV 220 conductors cross at intersections 225. As is typically the case with global programmable interconnect, GH 210 and GV 220 lines do not connect at intersections 225 unless they are programmably coupled. A pass transistor 410 and programmable memory cell 400 facilitate the programmable coupling of GH 210 to GV 220, and vice versa. In particular, depending on the data stored in memory cell 400, GH 210 and GV 220 conductors are programmably connected or programmably disconnected at intersection 225.

At intersection 225, pass transistor 410 is coupled between GH 210 and GV 220. A gate of pass transistor 410 is coupled to sensing node 405 of memory cell 400. Controlled by way of memory cell 400, pass transistor 410 programmably couples GH 210 to GV 220. For example, GV 220 and GH 210 may be connected together by storing a logic high in memory cell 400. Memory cell 400 would output a high level at sensing node 405, which is passed to the gate of pass transistor 410. A high at the gate of pass transistor 410 turns pass transistor 410 on, so that GV 220 is electrically coupled to GH 210. In the alternative, GV 220 and GH 210 may be disconnected from another by programming a zero into memory cell 400. In this manner, memory cell 400 of the present invention may be used to implement a global programmable interconnect structure for a PLD.

Furthermore, as discussed earlier, the present invention provides full-rail or "local" full-rail voltages at the gate of pass transistor 410. Therefore, pass transistor 410 will be either substantially on or substantially off. This allows GHs 210 and GVs 220 to conduct signals throughout the integrated circuit with generally good performance characteristics. For example, when pass transistor 410 is fully on (e.g., the gate is at VDD), the amount of resistance of pass transistor 410 is kept at a minimum, thus improving transient performance. Also, VDD at the gate of pass transistor 410 allows a voltage of about VDD−VT (a threshold voltage of pass transistor 410, including body effect) from one GH 210 or GV 220 conductor to another. Also, when pass transistor 410 is fully off (e.g., the gate is at VSS), no signals will pass (or "leak") from GH 210 or GV 220 conductor to another. Further, when pass transistor 410 is fully off, the GV 220 conductors intersecting a particular GH 210 conductor will not capacitively load that particular GH 210 conductor. These features improve the performance of the programmable logic device integrated circuit.

Pass transistor 410 may be fabricated using many different process technologies, including CMOS, NMOS, PMOS, and bipolar. In FIG. 4, pass transistor 410 is an NMOS transistor.

Figure 5A:
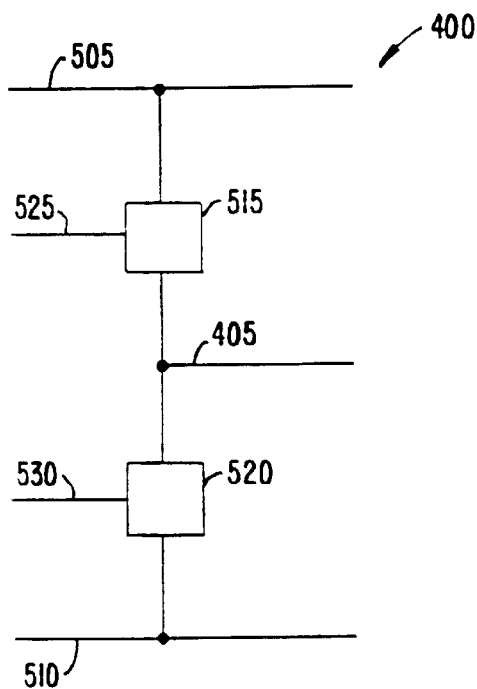
FIG. 5A is a block diagram of a memory cell of the present invention.

FIG. 5A shows a more detailed block diagram of memory cell 400 of the present invention. This block diagram of memory cell 400 shows a first voltage source 505 and a second voltage source 510. Specifically, first voltage source 505 and second voltage source 510 may be supplied using conductors which input the desired supply voltages, or even logic signals (e.g., from GHs, GVs, and combinatorial and registered logic elements), to the memory cells. In normal operation, second voltage 510 is typically at a voltage level below that of first voltage source 505. Second voltage source 510 is at approximately VSS or ground. In normal operation, first voltage source 505 is generally VDD (or VCC), the supply voltage for the integrated circuit. However, in other instances, a reduced voltage, less then VDD, may be used for first voltage source 505. Typically, first voltage source 505 will be at a voltage level of approximately 3.3 volts. However, first voltage source 505 may be at a voltage above 3.3 volts, such as 5 volts in some applications. Also, supply voltages for future integrated circuits may be lowered to approximately 2.5 volts. Consequently, first voltage source 505 may be at 2.5 volts in the future.

Furthermore in an embodiment, the supply voltages for memory cell 400 may not the same as the supply voltages for the integrated circuit. In this case, the first voltage level may not be about VDD. The second voltage level may not be about VSS. For example, VDD may be about 5 volts, but this voltage may be reduced to about 3.3 volts for coupling with to the internal circuits. In this case, the first voltage level may be a "local" VDD, a VDD which is coupled to memory cell 400 and possibly other internal circuitry. In another example, the supply voltage of the integrated circuit may be VDD, but the first voltage level for memory cell 400 may be about VDD−VT. In yet another example, VDD may be about 3.3 volts, and the first voltage level for memory cell 500 may be a higher voltage, about 5 volts.

A first programmable memory element 515 is coupled between first voltage source 505 and sensing node 405. A second programmable memory element 520 is coupled between sensing node 405 and second voltage source 510. Typically, first programmable memory element 515 is substantially similar to second programmable memory element 520. By having substantially similar programmable memory elements 515 and 520, the processing and fabrication of memory cell 400 is simplified, since processing controls need to be established for only one type of programmable memory element. Also, the programmable memory elements 515 and 520 can be matched more easily to optimize device features such as improved programming and performance characteristics. In other embodiments of the present invention, however, first programmable memory element 515 may not be substantially identical to second programmable memory element 520.

Programmable memory element 515 has two states, programmed or not programmed (erased). When programmable memory element 515 is not programmed, first voltage source 505 is coupled through memory element 515 to sensing node 405. When memory element 515 is programmed, first voltage source 505 is disconnected or decoupled from sensing node 405. Likewise, programmable memory element 520 also has two states. When programmable memory element 520 is not programmed, sensing node 405 is coupled through memory element 520 to second voltage source 510; and when programmable memory element 520 is programmed, sensing node 405 is disconnected or decoupled from second voltage source 510.

In operation, memory cell 400 provides either a high or low level at sensing node 405. In a first state, the high will be approximately equal to the voltage level of first voltage source 505. For example, if first voltage source 505 is 3.3 volts, then if memory cell 400 is storing a high, sensing node will be at about 3.3 volts. On the other hand, in a second state, memory cell 400 stores a logic low; sensing node 405 will be about equal the voltage level of the second voltage source 510. For example, if second voltage source 510 is VSS or zero volts, then sensing node 405 will be about equal to zero volts.

In the first state, memory cell 400 is configured to store a logic high; first programmable memory element 515 is not programmed, while second programmable memory element 520 is programmed. In this configuration, first voltage source 505 is connected to sensing node 405, while second voltage source 510 is disconnected from sensing node 405. Therefore, sensing node 405 will approximately equal the high voltage level at first voltage source 505.

In the second state, memory cell 400 is configured to store a logic low, programmable memory element 515 is programmed, while programmable memory element 520 is not programmed. In this configuration, sensing node 405 is disconnected from first voltage source 505, while sensing node 405 is connected to second voltage source 510. Thus, sensing node 405 will approximately equal the low voltage level of second voltage source 510. In the first state and second state, no current flows through memory cell 400, since at least one of the programmable memory elements is not conducting. Consequently, memory cell 400 has zero static power consumption.

Programmable memory elements 515 and 520 may be designed or fabricated from many different memory technologies. For example, programmable memory elements 515 and 520 may be designed and fabricated using one-time programmable devices such as fuses or antifuses. Or, programmable memory elements 515 and 520 may be designed and fabricated using reprogrammable memory technology such as EPROM, EEPROM, Flash EEPROM, and the like.

Furthermore, EPROM, EEPROM, Flash EEPROM technologies are nonvolatile and reprogrammable, which means that the stored information is retained even when power is removed. EPROM, EEPROM, Flash EEPROM cells have floating gates to provide for nonvolatility and reprogrammability. To program and erase (in appropriate cases) these cells, high voltages may be used to transfer charge to and remove charge from the floating gates through the silicon dioxide by various physical mechanisms such as avalanche injection, channel injection, quantum-mechanical tunneling, hot electrons, and other phenomena. The high voltage (VPP) used to program the memory cells may be somewhat different from the high voltage (VEE) used to erase the memory cells. The magnitude of the VPP and VEE depends on the thickness and composition of the dielectric between the substrate and the floating gate. Presently, VPP and VEE voltages of approximately 12 volts to 14 volts are used to program and erase the memory cells. However, as process technology continues to improve, it will become possible to fabricate thinner and better dielectrics. Consequently, the high voltages necessary for facilitating the transfer of charges to and from the floating gate will decrease in magnitude.

In the different memory technologies, the terms "programmed" and "erased" may have different meanings. To provide a consistent terminology for this specification, for EPROM, EEPROM, and Flash EEPROM technologies, the IEEE convention for these terms is used. Specifically, for EPROM, EEPROM, and Flash EEPROM technologies, "programmed" refers to placing a memory cell into device off or nonconducting state, and "erased" refers to placing a memory cell into a device on or conducting state.

For EEPROM and Flash EEPROM memory cells, to erase the cells, charge is electrically removed from the floating gate using high voltages and quantum-mechanical tunneling; while for EPROM memory cells, charge is removed from the floating gates by exposing the cells to radiation, such as ultraviolet light. Exposing EPROM memory cells to ultraviolet light neutralizes the charge in the floating gate. After erasure, EPROM, EEPROM, and Flash EEPROM memory cells may be reprogrammed. Specifically, EPROM and Flash EEPROM memory cells are generally programmed using hot electrons, while EEPROM cells are programmed using quantum-mechanical tunneling. In some cases, Flash EEPROM memory cells are programmed using quantum-mechanical tunneling. Moreover, EPROM, EEPROM, and Flash memory cells may be programmed, erased, and reprogrammed many times.

When the EPROM, EEPROM, and Flash EEPROM memory cells are programmed, charge is placed on the floating gate of a memory cell, which puts the memory cell in a high voltage threshold (VT) state (VTP). In the programmed or high VT state, a reasonable voltage on a gate of the memory cell will not turn the memory cell on. In this case, a reasonable voltage is a voltage between first voltage source 505 and second voltage source 510. In the case when a voltage above first voltage source 505 is placed on the gate, the memory cell may turn on. For example, for EPROM, EEPROM, and Flash EEPROM memory cells, the typical threshold voltage for a memory cell in a high VT state is approximately 4 volts. However, the high VT state may be above 4 volts. For example, for EPROM memory cells, the high VT state may be about 7 volts. When programmed using an "assist" technique (described below), the high VT state for EEPROM memory cells may be somewhat higher then 4 volts.

In contrast, when erased, charge is removed from the floating gate and the memory cell is placed in a low VT state (VTE). In the erased or low VT state, a reasonable voltage on a gate of the memory cell will turn the memory cell on. For EEPROM and Flash EEPROM memory cells, the typical threshold voltage for a memory cell in a low VT state ranges from approximately −2 volts to −3 volts. For EPROM memory cells, the typical threshold voltage in a low VT state is zero volts or slightly above zero volts.

When EEPROM or Flash EEPROM cells are erased using a "smart" algorithm, a specific low VT voltage level state may be achieved. For example, the VTE may be −1 volts. In another example, the VTE may be zero volts or slightly above zero volts. A smart algorithm removes charges from the floating gate using an iterative technique, removing small amounts of charge until a desired VTE is achieved. A smart algorithm may be used to prevent a negative VTE, especially important in some applications where a negative VTE is undesirable such as for high-density, high-capacity Flash EEPROM memories. In other applications such as programmable logic devices, a negative low VT state may be allowable because, among other reasons, the memory cell may be accessed using a read transistor in series with the memory cell. The present invention does not require the use of a smart algorithm since memory cell 400 operates and functions properly when programmable memory element 515 has a negative VTE.

Also, when an array of EPROM or Flash EEPROM memory cells is initialized, the cells are erased to a low VT state. For example, an EPROM array is initialized when exposed to ultraviolet light. Flash EEPROM memory cells are initialized when bulk erased. However, when an array of EEPROM memory cells is initialized, the cells typically may be programmed to a high VT state. The initiation state of a memory array is chosen based on many considerations including the fabrication of the memory cell devices themselves and the intended use for the memory cells.

In a further embodiment of the present invention, programmable memory elements 515 and 520 are coupled to control signals 525 and 530, respectively. Although shown as separate signals, control signals 525 and 535 may be coupled together and controlled by the same signal. Control signal 525 activates programmable memory element 515. Control signal 530 activates programmable memory element 520. Until activated, a programmable memory element will decouple its voltage source from sensing node 405. For example, when control signal 525 is a logic high, first programmable memory element 515 is activated. Otherwise, when control signal 525 is a logic low, programmable memory element 515 is not activated.

When activated, programmable memory element 515 will, depending on whether the memory element is erased or programmed, either couple or decouple first voltage source 505 and sensing node 405. Similarly, when activated, programmable memory element 520 will, depending on whether the memory element is erased or programmed, either couple or decouple second voltage source 510 from sensing node 405. In normal operation, when activating the programmable memory elements, control signals 525 and 530 are tied to a third voltage source which is greater than VTE and less than the VTP. However, in order to provide the greatest amount of programming and erase margin, the third voltage source is selected at a voltage at approximately in the center of VTE and VTP. For example, for typical EEPROM memory cells where VTE equals about −2 volts and VTP equals about 4 volts, the third voltage source may be in the range from approximately 1.7 volts to approximately 2 volts. For EPROM memory cells, where VTE equals about zero volts and VTP equals about 7 volts, control signals 525 and 530 may be tied to first voltage source 505 (a logic high) or to an even higher voltage level to activate the memory elements. A activation voltage above VDD may be used because for example, this may be required by the memory element, or a higher voltage level is readily available.

As discussed earlier, control signal 525 may be at a voltage different from control signal 530. In one embodiment, control signal 525 may be at a voltage above that of control signal 530. This allows programmable memory element 515 to pass the voltage level of first voltage source 505 to sensing node 405. For example, when VTE of programmable memory element 515 is −1.5 volts and first voltage source 505 is 5 volts, then to pass first voltage source 505 to sensing node 405, control signal 525 should be at least 3 volts. In this case, control signal 530 may be less than 3 volts, for instance, zero volts. Then voltage supply 510 (VSS) may still be passed through programmable memory element 520 to sensing node 405.

Figure 5B:
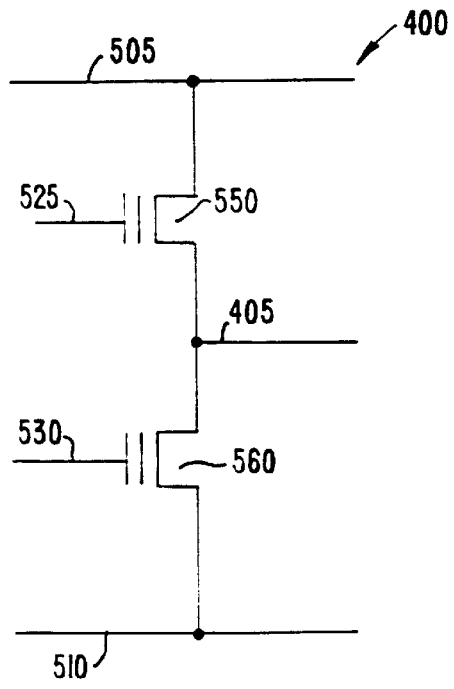
FIG. 5B is a diagram showing the memory cell of present invention implemented using EPROM cells.

FIG. 5B shows a specific embodiment of the programmable memory cell 400 of FIG. 5A. In this embodiment, programmable memory element 500 is implemented using an EPROM memory cell 550, and programmable memory element 520 is implemented using an EPROM cell 560. When initialized, EPROM memory cells 550 and 560 are erased to a low VT state. This means that EPROM memory cells 550 and 560 are conducting when activated. EPROM cell 550 is activated by a control signal 525, coupled to a gate of EPROM cell 550. EPROM cell 560 is activated by a control signal 530, coupled to a gate of EPROM cell 560. Control signals 525 and 530 activate EPROM cells 550 and 560, respectively, in a similar fashion as for programmable memory elements 515 and 520. In normal operation, EPROM cells 550 and 560 are activated.

Control signals 525 and 530 are also used during the programming of EPROM cells 550 and 560. For example, to program EPROM cell 550 to a high VT state, control signal 525 is set at a high voltage (VPP) of approximately 12 volts to 14 volts, while control signal 530, first voltage source 505, and second voltage source 510 are grounded. Sensing node 405 is set to an intermediate voltage of about 5 volts to 8 volts. The high voltage at control signal 525 attracts hot electrons into the floating gate of EPROM cell 550, causing the floating gate to become negatively charged. This operation programs EPROM cell 550 to a high VT state, so that in normal operation, EPROM cell 550 is nonconducting. This operation may similarly be performed using control signal 530 to program EPROM cell 560. When exposed to ultraviolet light, the ultraviolet radiation neutralizes the charges in the floating gates; EPROM cells 550 and 560 will become erased to a low VT state.

When EPROM cell 550 is erased to a low VT state, first voltage source 505 is coupled to sensing node 405. When EPROM cell 550 is programmed to a high VT state, first voltage source 505 is decoupled from sensing node 405. Similarly, when EPROM cell 560 is erased to a low VT state, sensing node 405 is coupled to second voltage source 510. When EPROM cell 560 is programmed to a high VT state, sensing node 405 is decoupled from second voltage source 510.

Since EPROM cells 550 and 560 are initialized to a low VT state, memory cell 400 of FIG. 5B is configured to store a logic high or logic low by programming the appropriate memory cell to a high VT state. In a first state, to store a logic high, EPROM cell 550 remains at a low VT state, while EPROM cell 560 is programmed to a high VT state. In a second state, to store a logic low, EPROM cell 560 remains at a low VT state, while EPROM cell 550 is programmed to a high VT state. Therefore, memory cell 400 of FIG. 5B stores data in a similar fashion to memory cell 400 of FIG. 5A. Furthermore, EPROM cells 550 and 560 may be erased and reprogrammed so that memory cell 400 stores new data. Since EPROM cells 550 and 560 are nonvolatile, memory cell 400 will retain its stored data even when power is removed.

Data stored in memory cell 400 is provided at sensing node 405. Typically, in the first state, a logic high is represented at sensing node 405 by a voltage at approximately the level of first voltage source 505. In the second state, a logic low is represented at sensing node 405 by a voltage at approximately the level of second voltage source 510. Since memory cell 400 outputs data at about full rail, no sense amplifier is necessary for memory cell 400 of the present invention, unlike other memory cell configurations. This effectively results in a reduction in the amount of integrated circuit area needed by memory cell 400. Also, since sense amplifiers generally consume power, memory cell 400 of the present invention reduces power consumption of the integrated circuit by removing the need for such sense amplifiers.

Memory cell 400 of the present invention also does not consume power during use. When storing data, only programmable memory element 550 (EPROM cell 550) or programmable memory element 520 (EPROM cell 560) is conducting. One of the programmable memory elements is nonconducting in normal operation, and consequently, no appreciable current is drawn from the power supplies. Therefore, the memory cell 400 of the present invention has no appreciable power consumption.

Figure 6A:
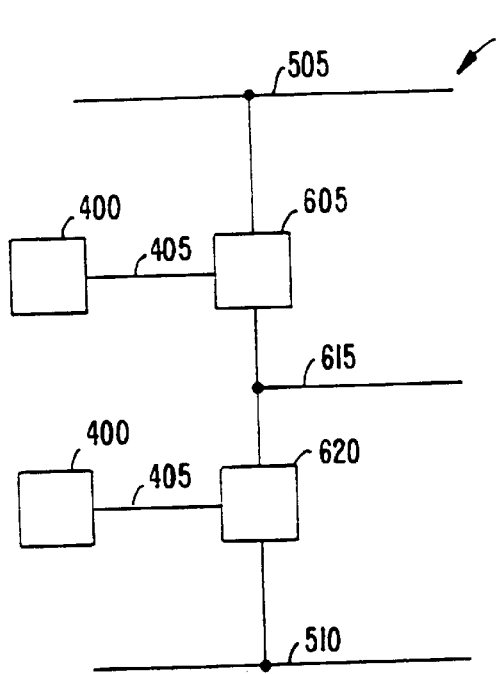
FIG. 6A is a block diagram of an embodiment where the memory cells of the present invention control switching devices.

FIG. 6A is a further embodiment of the present invention. FIG. 6A is a storage cell 602 which stores data based on two memory cells 400 of the present invention. A first programmable memory cell 400 of FIG. 5A is used to control a switch 605 coupled between first voltage source 505 and a sensing node 615. A second programmable memory cell 400 controls a second switch 620 coupled between sensing node 615 and second voltage source 510. Switch 605 couples or decouples first voltage source 505 to sensing node 615. Switch 620 couples or decouples second voltage source 510 to sensing node 615.

The storage cell 602 stores a logic high or logic low. A voltage level at sensing node 615 will represent the stored data. This voltage level is determined by the states of switches 605 and 620. Switch 605 is controlled by way of the stored state of first memory cell 400. Switch 620 is controlled by way of the stored state of second memory cell 400. For example, a logic high will be stored if switch 605 couples sensing node 615 to first voltage source 505 (first memory cell 400 stores a logic high), while switch 620 decouples second voltage source 510 from sensing node 615 (second memory cell 400 stores a logic low). In this case, the voltage level at sensing node 615 will be approximately equal to first voltage source 510. On the other hand, a logic low will be stored if switch 605 decouples sensing node 615 to first voltage source 505 (first memory cell 400 stores a logic low), while switch 620 couples second voltage source 510 from sensing node 615 (second memory cell 400 stores a logic high). In this case, the voltage level at sensing node 615 will be approximately equal to second voltage source 510.

Switches 605 and 620 may be constructed from many different types of switching devices. For example, such switching devices include relays, triodes, silicon controlled rectifiers (SCRs), transistors, and other such devices, and combinations of these. Switch 605 may be substantially similar to switch 620. However, in other embodiments, switches 605 and 620 need not be the same type of device.

Figure 6B:
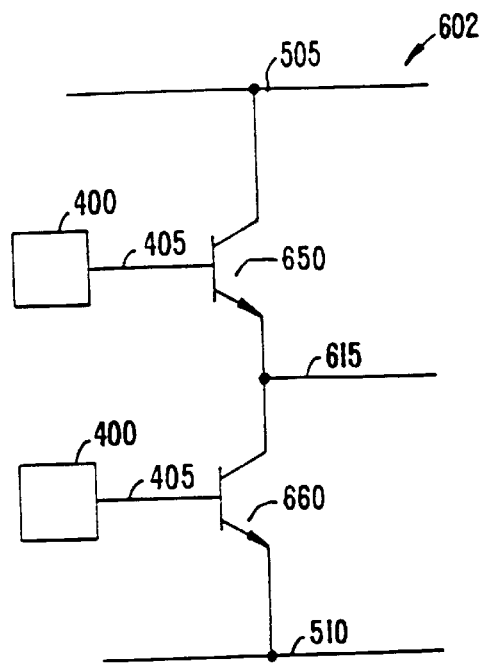
FIG. 6B is a diagram showing an embodiment where memory cells of the present invention control bipolar transistor switches.

FIG. 6B shows a specific embodiment of storage cell 602 shown in FIG. 6A. In this embodiment, switch 605 is implemented using a first bipolar transistor 650, and switch 620 is implemented using a second bipolar transistor 660. When a first memory cell 400 (coupled to bipolar transistor 650) stores a logic high, bipolar transistor 650 is on and sensing node 615 is effectively coupled to first voltage source 505. When first memory cell 400 stores a logic low, bipolar transistor 650 is off, and first voltage 610 is effectively decoupled from sensing node 615. This is similarly the case for bipolar transistor 660. As is the case for storage cell 602 of FIG. 6A, data is stored storage cell 602 of FIG. 6B by appropriately programming first and second memory cells 400.

Figure 7A:
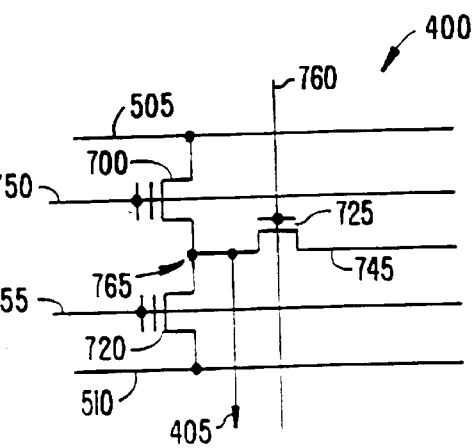
FIG. 7A shows a memory cell of the present invention implemented using one-transistor double-polysilicon Flash EEPROM memory cells.

FIG. 7A is a diagram of a memory cell 400 of the present invention. The embodiment shown in FIG. 7A is designed using one-transistor double-polysilicon Flash EEPROM memory cells. Memory cell 400 comprises the following devices: a first Flash EEPROM cell 700, a second Flash EEPROM cell 720, and a select transistor 725. Flash EEPROM cell 700 is a specific embodiment of programmable memory element 515 of FIG. 5A. Flash EEPROM cell 720 is a specific embodiment of programmable memory element 520 of FIG. 5A.

Flash EEPROM cell 700 is coupled between first voltage source 505 and sensing node 405. Flash EEPROM cell 720 is coupled between sensing node 405 and a second voltage source 510. Select transistor 725 is coupled between sensing node 405 and a erase node 745. Data from memory cell 400 of FIG. 7A is read or output from sensing node 405. Depending on the programmed or erased states of Flash EEPROM cell 700 and Flash EEPROM cell 720, sensing node 405 will represent a logic high or logic low.

Flash EEPROM cells 700 and 720 have two states, programmed and erased. As discussed earlier, when initialized, Flash EEPROM cells are erased to a low VT or conducting state. When erased, a Flash EEPROM cell becomes conducting, effectively coupling its drain terminal to its source terminal. In contrast, when programmed to a high VT state, a Flash EEPROM cell is nonconducting, effectively decoupling its drain terminal from its source terminal.

Flash EEPROM cell 700 has a first control gate 750 and Flash EEPROM cell 720 has a second control gate 755. First control gate 750 and second control gate 755 are analogous to control signals 525 and 530, respectively. These control gate signals are used to activate their respective Flash EEPROM cells in normal operation. First control gate 750 and second control gate 755 are set at voltages so that approximately full-rail voltage output is provided at sensing node 405. Furthermore, as discussed earlier, during normal operation, first control gate 750 and second control gate 755 are set at a voltage between the VTE and VTP of Flash EEPROM cells 700 and 720 to maximize the amount of programming and erase margin.

First control gate 750 may be set at a different voltage from second control gate 755. For example, first control gate 750 may be set at a voltage higher than second control gate 755 to allow Flash EEPROM cell 700 to pass the full-rail voltage at first voltage source 505 to sensing node 405. Although second control gate 755 is at a voltage lower than first control gate 750, Flash EEPROM cell 720 will still pass the full-rail voltage at second voltage source 510 to sensing node 405. For example, first control gate 750 may be set at 2.5 volts, while second control gate 755 is set at 1.7 volts. However, in other instances, in order to simplify the circuity and layout of the memory cell, first control gate 750 and second control gate 755 may be set to the same voltage source. Typically, since VTE is about −2 volts and VTP is about 4 volts, the first control gate 750 and second control gate 755 are generally in the range of 1.7 volts to 2 volts during normal operation.

By appropriately configuring Flash EEPROM cells 700 and 720 in either programmed or erased states, memory cell 400 may store a logic high in a first state and a logic low in a second state. For example, in the first state, to store a logic high, Flash EEPROM cell 700 remains erased in a low VT state, while Flash EEPROM cell 720 is programmed in a high VT state. Then, sensing node 405 will approximately equal the voltage level of the first voltage source 505, which represents a logic high. In the second state, to store a logic low, Flash EEPROM cell 720 remains erased in a low VT state, while Flash EEPROM cell 700 is programmed to a high VT state. Then, sensing node 405 will approximately equal the voltage level of second voltage source 510, which represents a logic low.

When memory cell 400 stores a logic high, Flash EEPROM cell 700 is conducting, while Flash EEPROM cell 720 is nonconducting. When memory cell 400 stores a logic low, Flash EEPROM cell 700 is nonconducting, while Flash EEPROM cell 720 is conducting. In either case, memory cell 400 does not draw current from the power supplies. Therefore, memory cell 400 consumes no appreciable power when storing and representing a stored state.

Memory cell 400 may also be used to perform logical functions. For example, memory cell 400 may be used to implement lookup tables, multiplexers, decoders, registers, and many other types of logical block and functions. For example, first voltage source 505 and second voltage source 510 may be used to conduct logical signals, and based on the states of cells 700 and 720, a desired logical function may be implemented. A full-rail voltage would be passed to sensing node 405. First voltage source 505 and second voltage source 510 may be signal conductors (e.g., GHs and GVs discussed above). The routing of these conductors would be determined by the states of cells 700 and 720.

Select transistor 725 is used during the programming and erasure of Flash EEPROM cells 700 and 720. To initialize (erase) Flash EEPROM cells 700 and 720 to a low VT state, VEE+VTN (a threshold voltage of select transistor 760) is placed on a select gate 760 of select transistor 725. VEE is placed at erase node 745. As discussed earlier, VEE is a high voltage used for erasing the memory cells. VEE is typically in the range of 12 volts to 14 volts. First control gate 750 and second control gate 755 are held at a low voltage, grounded or negative. When erasing the memory cells, a negative assist programming technique may be used by placing a negative assist voltage on the control gates. For example, a voltage of −3 volts may be placed on control gates 750 and 755. This would decrease VTE, improving the erase margin of EEPROM cells 700 and 720.

First voltage source 505 and second voltage source 510 are grounded. VEE is passed through select transistor 725 to a tunnel dielectric (TD) source 765, shared by Flash EEPROM cells 700 and 720. TD source 765 is a diffusion region of memory cell 400. For example, TD source 765 may be comprised of n+ diffusion. Moreover, TD source 765 may be a single diffusion region. TD source 765 may also be separate diffusion regions coupled together via a conductor. Typically, one or more tunnel dielectrics are positioned above TD source 765. A first tunnel dielectric is associated with Flash EEPROM cell 700, and a second tunnel dielectric is associated with Flash EEPROM cell 720. In operation, from TD source 765, electrons may tunnel, in both directions, through the first tunnel dielectric via quantum-mechanical tunneling to and from the floating gate of Flash EEPROM cell 700. Similarly, from TD source 765, electrons may tunnel, in both directions, through the second tunnel dielectric via quantum-mechanical tunneling to and from the floating gate of Flash EEPROM cell 720. For example, a high voltage VEE at TD source 765 attracts electrons out of the floating gates of EEPROM cells 700 and 720. Flash EEPROM cells 700 and 720 are erased using quantum-mechanical tunneling. This places Flash EEPROM cells 700 and 720 in a low VT state. The VTE of Flash EEPROM cells 700 and 720 is approximately −2 volts. The time to erase Flash EEPROM cells 700 and 720 is typically about one hundred milliseconds. However, since the specific value of VTE is not critical, as long as VTE is zero volts or less, the erase time may be less than one hundred milliseconds, and may also be very much greater than one hundred milliseconds.

To program memory cell 400, Flash EEPROM cell 700 or Flash EEPROM cell 720 is programmed to a high VT state. To program Flash EEPROM cell 720, but not Flash EEPROM cell 700, VPP is placed on second control gate 755. As discussed earlier, VPP is a high voltage used for programming the memory cells. VPP is typically in the range of 12 volts to 14 volts. A VPD voltage is placed on second voltage source 510. VPD is selected to optimize the efficient programming of Flash EEPROM cell 720. These considerations include ensuring that Flash EEPROM cell is programmed well, minimizing any destructive effects on the cell, and observing the current density constraints of the power conductors. In one embodiment, VPD is about 6 volts. Select gate 760 is placed at a voltage sufficient to turn select transistor 725 on, which is about 2 volts or above. Erase node 745, first voltage source 505, and first control gate 750 are grounded.

Figure 7B:
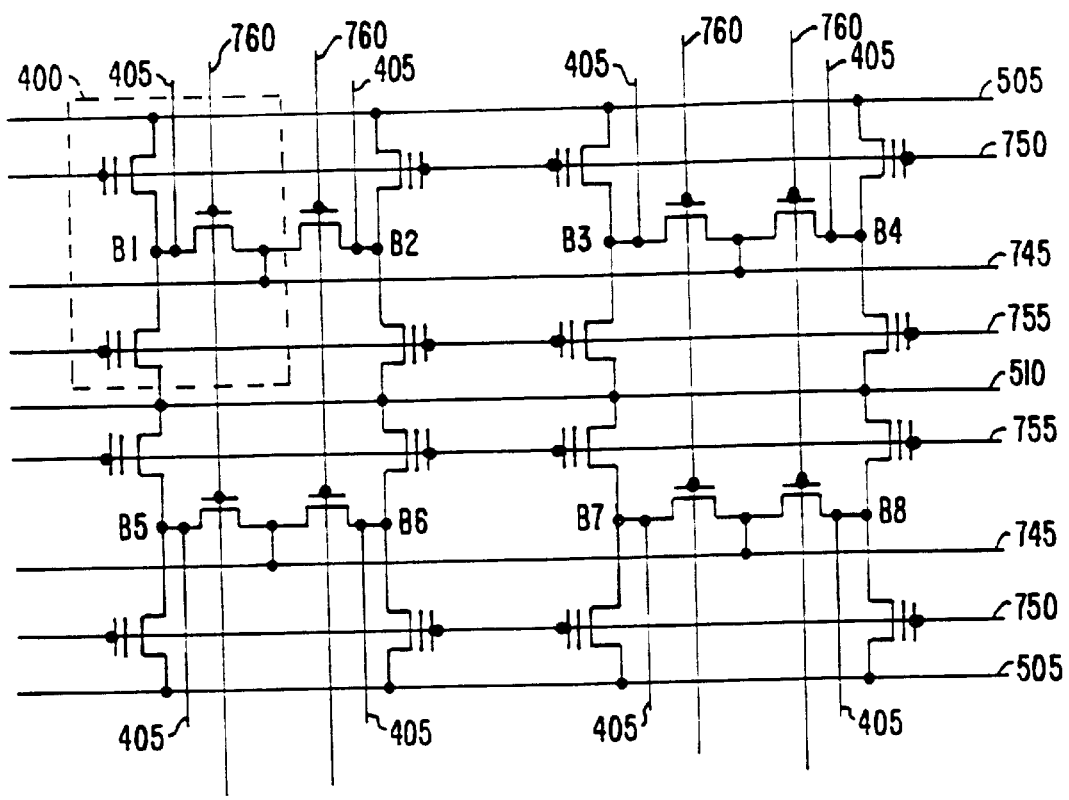
FIG. 7B is a simplified layout diagram of four cells of FIG. 7A.

Alternatively, first voltage source 505 may be left floating in the case when programming Flash EEPROM cell 720, but not Flash EEPROM cell 700. This may be preferable especially for an array of memory cells, such as shown in FIG. 7B. By floating first voltage source 505, this will tend to minimize potential conditions which may disturb the states of adjacent cells (e.g., cells in the same row and column), as well as minimizing potential overstress of the adjacent cells. Furthermore, first voltage source may be set at an intermediate voltage, above ground and below VPP, which would also minimize creating undesirable potential disturb conditions. In an embodiment, this voltage may be selected to minimize gate-to-source bias on the cells. For example, if a relative VT of an erased Flash cell is about 3 volts (i.e., a low VT state of about −3 volts), then an intermediate voltage of about 3 volts at first voltage source 505 will minimize potentially disturbing the states of adjacent cells. More specifically, when first voltage source 505 is about 3 volts, this will tend to avoid biasing on the Flash cells since a gate-to-source bias voltage is not sufficient to turn on the cells. Therefore, the intermediate voltage selected may be above the relative VT of an erased Flash cell. For example, this voltage may be in a range from 3 volts to VPP. However, it is desirable to select a voltage that also minimizes stressing the Flash cells, or possibly disturbing the states of the Flash cells by other mechanisms such as tunneling.

Under the above conditions, a significant current flows from second voltage source 510 through Flash EEPROM cell 720 to sensing node 405 and erase node 745. For example, this current may be about five hundred microamps. This current generates hot electrons, some of which jump a dielectric barrier and become trapped in the floating gate of Flash EEPROM cell 720. This floating gate becomes negatively charged. Flash EEPROM cell 720 is programmed to a high VT state. VTP is typically about 4 volts. Flash EEPROM cell 700 is programmed similarly to Flash EEPROM cell 720.

Memory cell 400 of FIG. 7A may also be both programmed and erased using quantum-mechanical tunneling. This may be referred to as full $E^2$ operation of the memory cell. The following example shows how Flash EEPROM cells may be programmed and erased using full $E^2$ operation. In this case, the Flash EEPROM cells are initialized (or bulk programmed) to the high VT state. First control gate 750 and second control gate 755 are coupled to VPP. First voltage source 505, second voltage source 510, and erase node 745 are grounded. Select gate 760 is placed at a voltage sufficient to turn select transistor 725 on, which is about 2 volts or above. Electrons tunnel from TD source 765 to the floating gates. As a result, Flash EEPROM cells 700 and 720 are programmed to the high VT state.

During initialization, first voltage source 505, second voltage source 510, and erase node 745 may also be set at a voltage level below VPP, and not necessarily ground. For example, this voltage may be set at a voltage of about 3 volts for similar reasons to those discussed above for minimizing overstress of the cells. These voltages may be applied directly at first voltage source 505, second voltage source 510, and erase node 745. As an alternative, a voltage may be applied directly at erase node 745 and coupled to first voltage source 505 and second voltage source 510 through Flash EEPROM cells 700 and 720, respectively. As a further alternative, a voltage may be applied directly at one or both the voltage sources, 505 or 510, and coupled through a Flash EEPROM cell to the sensing node 765. In this case, select transistor 725 need not be turned on.

In full $E^2$ operation, the Flash EEPROM cells are selectively erased to a low VT state. For example, to erase Flash EEPROM cell 700, but not Flash EEPROM cell 720, first control gate 750 is grounded or placed at a negative voltage (for negative assist programming as discussed above). Erase node 745 is coupled to VEE. In order to pass VEE to TD source 765, select gate 760 is coupled to VEE+VT or above. First voltage source 505 and second voltage source 510 are left floating (isolated from other circuits). Second control gate 755 will be generally at an intermediate voltage of approximately VEE/2. However, this intermediate erase voltage may range anywhere from about 0.35 to about 0.95 of VEE. Electrons will tunnel from the floating gate of Flash EEPROM cell 700 to TD source 765. Flash EEPROM cell 700 is erased to a low VT state. The intermediate voltage on second control gate 755 is large enough to prevent electrons from tunneling for Flash EEPROM cell 720. This intermediate voltage will generally be in the range from 5 volts to 10 volts. In some cases, a voltage as high as VEE may be coupled to second control gate 755 in order to prevent electrons from tunneling; however, as this voltage on control gate 755 becomes greater, a concern is that this voltage may disturb the states of other cells in an array of memory cells.

FIG. 7B shows an array of memory cells 400 of FIG. 7A. Memory cells 400 are implemented using one-transistor double-polysilicon Flash EEPROM memory cells. FIG. 7B shows eight memory cells 400 of FIG. 7A. However, larger arrays of memory cells 400 may be constructed by mirroring and exploiting the symmetry of memory cells 400, and other similar techniques.

FIG. 7B also shows an example of how the layout of an array of memory cells 400 of FIG. 7A may be compacted to save integrated circuit area. There are a plurality of signals in a first direction and a plurality of signals in a second direction. In this embodiment, the signals in the first direction are substantially transverse to the signals in the second direction. In the first direction, the signals include first voltage source 505, second voltage source 510, first control gate 750, second control gate 755, and erase node 745. In the second direction, the signals include select gate 760. Sensing node 405 may be a local connection which may be routed as needed to couple to the appropriate device or devices, or locations. These control signals are coupled to the corresponding nodes in the memory cell 400. This configuration of signals provides for efficient layout of memory cells 400, while providing for the programming, erasing, and accessing of the memory cells 400. For example, all Flash EEPROM cells of FIG. 7B may be erased to a low VT state in a single operation. Furthermore, the arrangement of the signals facilitates the efficient routing of signals in the integrated circuit.

Furthermore, there are many other possible configurations to form an array of memory cells of the present invention. For example, the control signals may be layed out differently than shown. First control gate 750 and second control gate 755 may be run in the second direction. The layout of the control signals and devices should facilitate easy access and implementation of the features of the memory cells, including testing, margining, evaluating, programming, erasing, and operating the cells. The layout should also be compact. Moreover, the specific configuration of an array of memory cells may also depend on the process technology and available process layers and conductors.

An array of memory cells 400 is a method of compactly arranging memory cells 400 on an integrated circuit. Although memory cells 400 may be laid out together on the integrated circuit, each memory cell 400 may drive logic and other components in many different locations on the integrated circuit.

FIG. 7B also shows an example of how the memory cell of the present invention may be used in a memory integrated circuit such as a random access memory or Flash RAM or ROM, as well as others. In such a case, data would not necessarily be read directly from node 405. Instead, data would be read from the appropriate row and column addresses (possibly supplied by decoder logic). Data may be selectively passed and read through nodes 745.

Figure 8A:
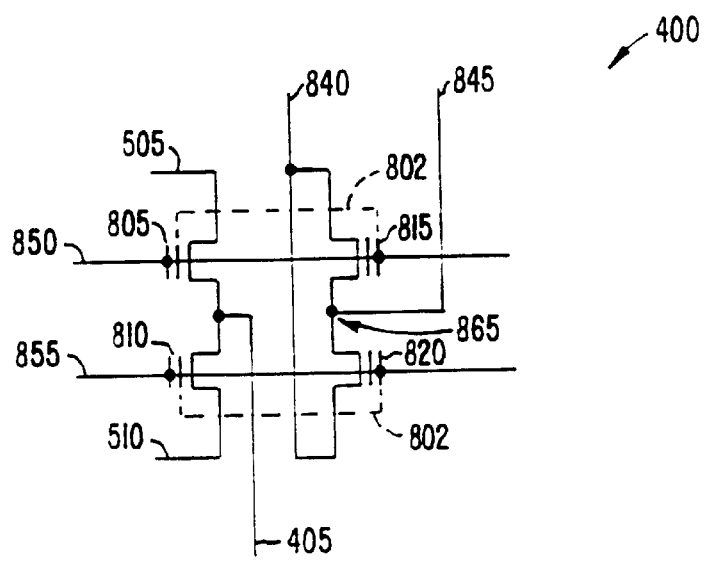
FIG. 8A shows a memory cell of the present invention implemented using two-transistor double-polysilicon Flash EEPROM memory cells.

FIG. 8A shows memory cell 400 of the present invention implemented using two-transistor double-polysilicon Flash EEPROM memory cells. The electrical characteristics of the Flash EEPROM memory cells in this configuration are similar to those discussed above. In this embodiment, memory cell 400 includes the following devices: a Flash EEPROM read cell 805, a Flash EEPROM read cell 810, a Flash EEPROM program cell 815, and a Flash EEPROM program cell 820. In this configuration, Flash EEPROM read cell 805 shares a floating gate 802 with Flash EEPROM program cell 815. And, Flash EEPROM read cell 810 shares a floating gate 802 with Flash EEPROM program cell 820.

Flash EEPROM read cell 805 and Flash EEPROM read cell 810 are configured to store data in memory cell 400. Flash EEPROM read cell 805 is coupled between first voltage source 505 and sensing node 405. Flash EEPROM read cell 810 is coupled between sensing node 405 and second voltage source 510. Data stored in memory cell 400 is read or output from sensing node 405. Depending on the states of Flash EEPROM read cell 805 and Flash EEPROM read cell 810, sensing node 405 will represent a logic high or logic low.

Flash EEPROM program cell 815 and Flash EEPROM program cell 820 facilitate the configuration of EEPROM read cells 805 and 810. Flash EEPROM program cell 815 is coupled between a program node 840 and an erase node 845. Flash EEPROM program cell 820 is coupled between erase node 845 and program node 840.

A first control gate 850 is coupled to a gate of Flash EEPROM read cell 805 and a gate of Flash EEPROM program cell 815. A second control gate 855 is coupled to a gate of Flash EEPROM read cell 810 and a gate of Flash EEPROM program cell 820. First control gate 850 and second control gate 855 are analogous to first control gate 750 and second control gate 755, respectively. These control gate signals are used to activate their respective Flash EEPROM read cells. For normal operation of memory cell 400, first control gate 850 and second control gate 855 are set at voltages so that approximately full-rail voltage output is provided at sensing node 405. More specifically, as described earlier, during normal operation, first control gate 850 and second control gate 855 are set at a voltage between the VTE and VTP of Flash EEPROM read cells 805 and 810 to maximize the amount of programming and erase margin. In one embodiment, this voltage is in the range from approximately 1.7 volts to 2 volts. Also, as discussed previously, first control gate 850 may be set at a different voltage from second control gate 855.

By appropriately configuring Flash EEPROM read cells 805 and 810 in either programmed or erased states, memory cell 400 may store a logic high in a first state and a logic low in a second state. Flash EEPROM memory cells are initialized to a low VT state. In the first state, to store a logic high, Flash EEPROM read cell 805 remains erased in a low VT state, while Flash EEPROM read cell 810 is programmed to a high VT state. Then, sensing node 405 will approximately equal to the level of the first voltage source 505, which represents a logic high. In the second state, to store a logic low, Flash EEPROM read cell 810 remains erased in a low VT state, while Flash EEPROM read cell 805 is programmed to a high VT state. Then, sensing node 405 will approximately equal the voltage level of second voltage source 510, which represents a logic low.

When memory cell 400 stores a logic high, Flash EEPROM read cell 805 is conducting, while Flash EEPROM read cell 810 is nonconducting. When memory cell 400 stores a logic low, Flash EEPROM cell 805 is nonconducting, while Flash EEPROM cell 810 is conducting. In either case, memory cell 400 does not draw current from the power supplies. Therefore, memory cell 400 consumes no appreciable power when storing and representing a stored state.

Flash EEPROM program transistor 815 is used to program and erase Flash EEPROM read cell 805. Flash EEPROM program transistor 820 is used to program and erase Flash EEPROM read cell 810. To initialize (erase) Flash EEPROM cells 805, 810, 815, and 820 to a low VT state, VEE is placed at erase node 845. First control gate 850 and second control gate 855 are held at a low voltage, grounded or negative. First voltage source 505, second voltage source 510, and program node 840 are grounded. VEE is coupled to a tunnel dielectric (TD) source 865, shared by Flash EEPROM program cells 815 and 820. TD source 865 is a diffusion region of memory cell 400. For example, TD source 865 may be comprised of n+ diffusion. Moreover, TD source 865 may be a single diffusion region. TD source 865 may also be separate diffusion regions coupled together via a conductor. Typically, one or more tunnel dielectrics are positioned above TD source 865. For example, one tunnel dielectric is associated with Flash EEPROM program cell 815, and another tunnel dielectric is associated with Flash EEPROM program cell 820. From TD source 865, via the appropriate tunnel dielectric, electrons may pass to and from the floating gates of Flash EEPROM program cells 815 and 820, and consequently through the shared floating gates to Flash EEPROM read cells 805 and 810. A high voltage VEE at TD source 865 attracts electrons out of the floating gates of Flash EEPROM cells 805, 810, 815, and 820. Flash EEPROM cells 805, 810, 815, and 820 are erased using quantum-mechanical tunneling. This places Flash EEPROM cells 805, 810, 815, and 820 in a low VT state. The VTE of Flash EEPROM cells 805, 810, 815, and 820 is approximately −2 volts. The time to erase Flash EEPROM cells 805, 810, 815, and 820 is typically about one hundred milliseconds. However, since the specific value of VTE is not critical, as long as VTE is zero volts or less, the erase time may be less than one hundred milliseconds, and may also be very much greater than one hundred milliseconds.

To program memory cell 400, Flash EEPROM cells 805 and 810 or Flash EEPROM cells 815 and 820 are programmed to a high VT state. To program Flash EEPROM cells 810 and 820, but not Flash EEPROM cells 805 and 815, VPP is placed on second control gate 855. A VPD voltage is placed on program node 840. VPD is selected to optimize the efficient programming of Flash EEPROM program cell 820. These considerations include ensuring that Flash EEPROM cell is programmed well, minimizing any destructive effects on the cell, and observing the current density constraints of the power conductors. In one embodiment, VPD is about 6 volts. Erase node 845, first voltage source 505, second voltage source 510, and first control gate 850 are grounded.

Under these conditions, a significant current flows from program node 840 through Flash EEPROM program cell 820 to erase node 845. For example, this current may be about five hundred microamps. This current generates hot electrons, some of which jump a dielectric barrier and become trapped in the shared floating gate of Flash EEPROM cells 810 and 820. This floating gate becomes negatively charged. Flash EEPROM cells 810 and 820 are programmed to a high VT state. VTP is typically about 4 volts. Flash EEPROM cells 805 and 815 may be programmed similarly to Flash EEPROM cells 810 and 820.

Furthermore, VTP may be boosted to a higher value by using an "assist" programming technique. In assist programming, when programming Flash EEPROM cells 810 and 820, for example, second voltage source 510 is set at VDD. Since second control gate 855 is VPP, sensing node 405 is also at about VDD. Under these conditions, more electrons become trapped in the floating gate than under the programming conditions described above. Hence, the floating gate is programmed to a higher VTP. Flash EEPROM cells 805 and 815 may be programmed using an assist programming technique similarly to Flash EEPROM cells 810 and 820.

Figure 8B:
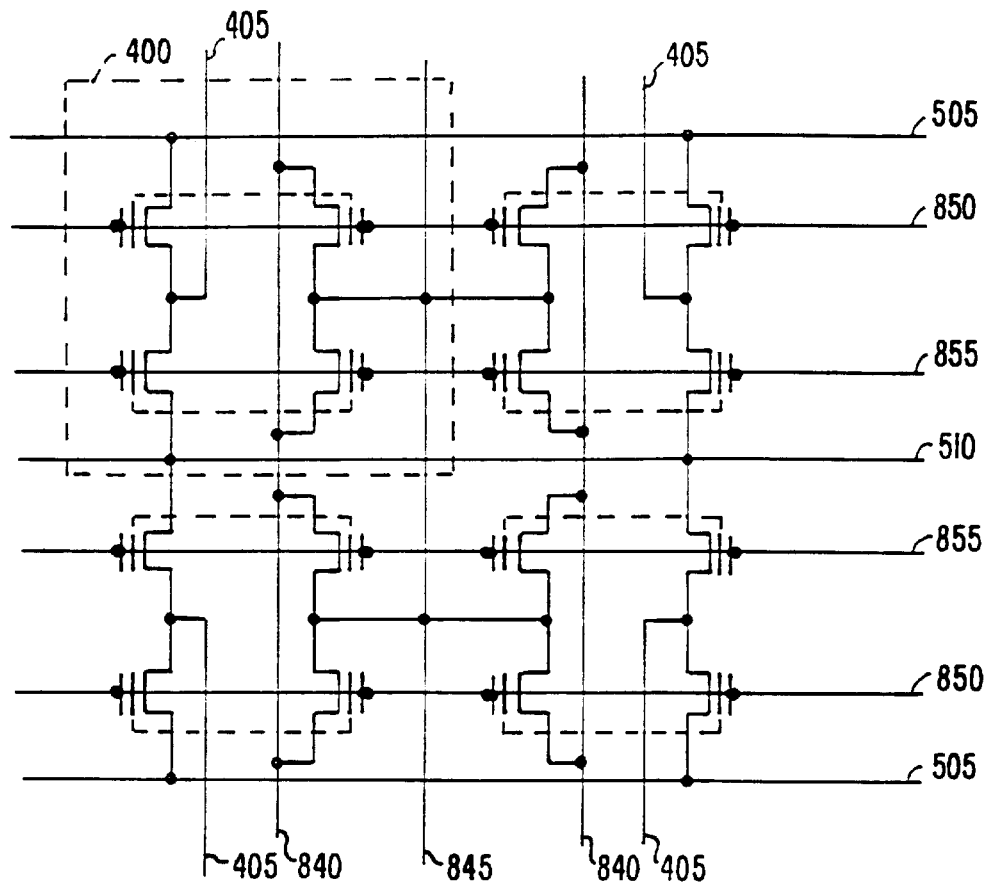
FIG. 8B is a simplified layout diagram of four cells of FIG. 8A.

The shared floating gate configuration, as shown in FIG. 8A, has several advantages related to layout and processing considerations. The layout of the memory cell 400 of FIG. 8A minimizes the sizes of the steps due to the semiconductor processing, so that the metal lines and other conductors which run across an array of memory cells 400 (such as shown in FIG. 8B) will not become too thin. More specifically, as the steps of an integrated circuit become steeper, the metal lines that traverse over and cover these steps become thinner at the corners of these steps. If the metal lines become too thin, this may lead to breaks or fractures in the lines. The layout of the shared floating gate configuration shown in FIG. 8A tends to have a flatter topography, which minimizes the step sizes. This feature of the present invention helps prevent the problems of breaks and fractures in the metal lines as well as other process layers.

Furthermore, the present invention shares floating gate 802 between Flash EEPROM read cell 805 and Flash EEPROM program cell 815, and similarly, between Flash EEPROM read cell 810 and Flash EEPROM program cell 820. Sharing floating gate 802 enables the optimization of the programming and read characteristics of the Flash EEPROM program and read cells to achieve longer device lifespans, improve data retention, and increase performance. A reason for this is that Flash EEPROM read cell 805 and Flash EEPROM program cell 815, for example, can be doped, controlled, and processed somewhat independently from each other. For example, Flash EEPROM program cell 815 can be optimized to improve ease of programming the floating gate; in contrast, Flash EEPROM read cell 805 may be optimized to improve the programming margin, thereby increasing memory cell longevity. In a similar fashion, the programming and read characteristics of Flash EEPROM read cell 810 and Flash EEPROM program cell 820 may also be controlled independently.

In this embodiment, TD source 865 is shared by Flash EEPROM program cells 815 and 820. In other embodiments, another TD source may be similarly shared by Flash EEPROM read cells 805 and 810. This additional TD source and associated tunnel dielectrics will facilitate the convenient and efficient transfer of electrons to and from the shared floating gate. However, when only one TD source 865 is used, memory cell 400 can still be programmed efficiently, and the processing and fabrication of memory cell 400 is somewhat simplified. Overall, the embodiment of the present invention shown in FIG. 8A produces memory cells 400 with higher read current, better programming characteristics, and enhanced device longevity.

FIG. 8B shows an array of memory cells 400 of FIG. 8A. Memory cells 400 are implemented using two-transistor double-polysilicon Flash EEPROM memory cells. FIG. 8B shows four memory cells 400 of FIG. 8A. However, larger arrays of memory cells 400 may be constructed by mirroring and exploiting the symmetry of memory cells 400, and other similar techniques.

FIG. 8B also shows now the layout of an array of memory cells 400 of FIG. 8A may be compacted to save integrated circuit area. There are a plurality of signals in a first direction and a plurality of signals in a second direction. In this embodiment, the signals in the first direction are substantially transverse to the signals in the second direction. In the first direction, the signals include first voltage source 505, second voltage source 510, first control gate 850, and second control gate 855. In the second direction, the signals include program node 840 and erase node 845. Sensing node 405 may be a local connection which may be routed as needed to couple to the appropriate device or devices, or locations. These control signals are coupled to the corresponding nodes in the memory cell 400. Note that one erase node 845 signal line is shared among four memory cells, which allows a more compact layout. Also, this permits erasing of all Flash EEPROM cells of FIG. 8B to a low VT state in a single operation. Besides providing for an efficient layout of memory cells 400, the configuration of the signal lines shown in FIG. 8B also allows for the efficient routing of signals in the integrated circuit.

Furthermore, as discussed earlier, there are many other possible configurations to form an array of memory cells of the present invention. For example, first voltage source 505 and second voltage source 510 may be layed out running in the second direction.

The control lines of the present invention are organized using a grid system. This routing of signals allows easier programming, erasing, and reading of memory cells 400.

Memory cells 400 may be configured row by row, many bits at a time, until the array of memory cells 400 is configured. For example, in one embodiment, eight memory cells 400 may be configured at one time. More specifically, a row of memory cells 400 may be selectively programmed by providing VPD on program node 840 and grounding erase node 845. Then, by selectively setting the appropriate control gates 850 and 855 at VPP, the desired Flash EEPROM memory cells in that row are selectively programmed at the same time.

An array of memory cells 400 is a method of compactly arranging memory cells 400 on an integrated circuit. Although memory cells 400 may be laid out together on the integrated circuit, each memory cell 400 may drive logic and other components in many different locations on the integrated circuit.

Figure 8C:
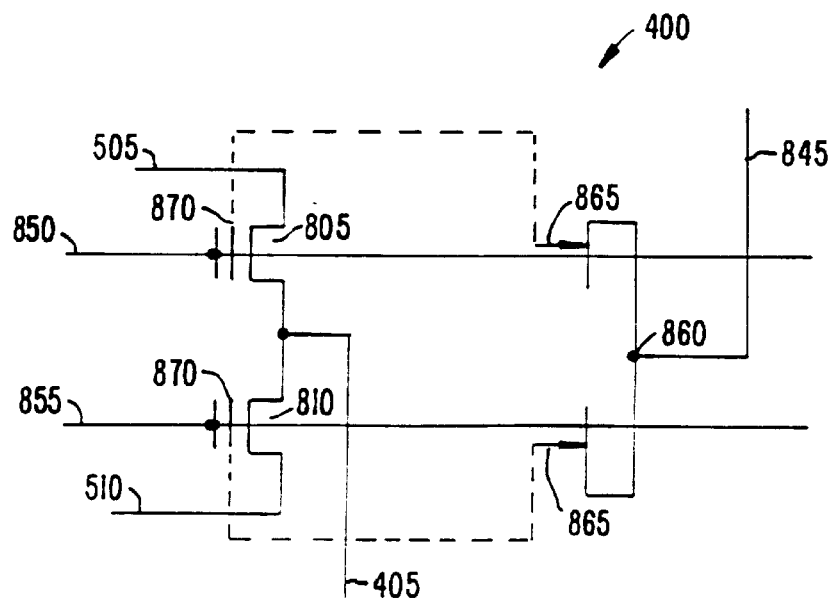
FIG. 8C shows another embodiment of a memory cell of the present invention implemented using Flash EEPROM memory cells.

FIG. 8C shows memory cell 400 of the present invention implemented using "one-and-a-half"-transistor single- or double-polysilicon Flash EEPROM memory cells. The electrical characteristics of the Flash EEPROM memory cells in this configuration are similar to those discussed above. This embodiment of memory cell 400 is very compact and includes the following devices: a Flash EEPROM read cell 805, a Flash EEPROM read cell 810, a tunnel diode 860, and tunnel dielectrics 865. Flash EEPROM read cell 805 and Flash EEPROM read cell 810 have floating gates 870.

Flash EEPROM read cell 805 and Flash EEPROM read cell 810 are configured to store data in memory cell 400. Flash EEPROM read cell 805 is coupled between first voltage source 505 and sensing node 405. Flash EEPROM read cell 810 is coupled between sensing node 405 and second voltage source 510. Data stored in memory cell 400 is read or output from sensing node 405. Depending on the states of Flash EEPROM read cell 805 and Flash EEPROM read cell 810, sensing node 405 will represent a logic high or logic low.

Tunnel diode 860 facilitates the configuration of Flash EEPROM read cells 805 and 810. Tunnel diode 860 is coupled to erase node 845. Tunnel diode 860 is shared by a tunnel dielectric 865, coupled to floating gate 870 of Flash EEPROM read cell 805. Tunnel diode 860 is also shared by a tunnel dielectric 865, coupled to floating gate 870 of Flash EEPROM read cell 810. In other embodiments of the present invention, a separate tunnel diode 860 may be used for Flash EEPROM read cell 805 and Flash EEPROM read cell 810.

A first control gate 850 is coupled to a gate of Flash EEPROM read cell 805. A second control gate 855 is coupled to a gate of Flash EEPROM read cell 810. First control gate 850 and second control gate 855 are analogous to first control gate 750 and second control gate 755, respectively. These control gate signals are used to activate their respective Flash EEPROM read cells. For normal operation of memory cell 400, first control gate 850 and second control gate 855 are set at voltages so that approximately full-rail voltage output is provided at sensing node 405. More specifically, as described earlier, during normal operation, first control gate 850 and second control gate 855 are set at a voltage between the VTE and VTP of Flash EEPROM read cells 805 and 810 to maximize the amount of programming and erase margin. In one embodiment, this voltage is in the range from approximately 1.7 volts to 2 volts. Also, as discussed previously, first control gate 850 may be set at a different voltage from second control gate 855.

By appropriately configuring Flash EEPROM read cells 805 and 810 in either programmed or erased states, memory cell 400 may store a logic high in a first state and a logic low in a second state. The Flash EEPROM memory cells are initialized to a high VT state. In the first state, to store a logic high, Flash EEPROM read cell 805 is erased to a low VT state, while Flash EEPROM read cell 810 remains programmed in a high VT state. Then, sensing node 405 will approximately equal to the level of the first voltage source 505, which represents a logic high. In the second state, to store a logic low, Flash EEPROM read cell 810 is erased to a low VT state, while Flash EEPROM read cell 805 remains programmed in a high VT state. Then, sensing node 405 will approximately equal the voltage level of second voltage source 510, which represents a logic low.

When memory cell 400 stores a logic high, Flash EEPROM read cell 805 is conducting, while Flash EEPROM read cell 810 is nonconducting. When memory cell 400 stores a logic low, Flash EEPROM read cell 805 is nonconducting, while Flash EEPROM read cell 810 is conducting. In either case, memory cell 400 does not draw current from the power supplies. Therefore, memory cell 400 consumes no appreciable power when storing and representing a stored state.

In this embodiment, Flash EEPROM read cells 805 and 810 may be programmed and erased using quantum-mechanical tunneling. As discussed earlier, this may be referred to as full $E^2$ operation of the memory cell. The following example shows how this configuration of Flash EEPROM cells may be programmed and erased using full $E^2$ operation. In this case, the Flash EEPROM cells are initialized (or bulk programmed) to the high VT state. First control gate 850 and second control gate 855 are coupled to VPP. First voltage source 505, second voltage source 510, and erase node 845 are grounded. However, an assist technique may be used to achieve a higher VTP by placing VDD or a higher voltage at first voltage source 505 and second voltage source 510. Electrons tunnel from tunnel diode 860, through the tunnel dielectrics 865, to floating gates 870. As a result, Flash EEPROM read cells 805 and 810 are programmed to the high VT state.

In full $E^2$ operation, the Flash EEPROM cells are selectively erased to a low VT state. For example, to erase Flash EEPROM read cell 805, but not Flash EEPROM read cell 810, first control gate 850 is grounded or placed at a negative voltage (for negative assist programming as discussed above). First voltage source 505 and second voltage source 510 are grounded. Erase node 845 is coupled to VEE. Second control gate 855 will be generally at an intermediate voltage of approximately ¾ VEE. Electrons will tunnel from the floating gate of Flash EEPROM cell 805 to tunnel diode 860. Flash EEPROM cell 805 is erased to a low VT state. The intermediate voltage on second control gate 855 is large enough to prevent electrons from tunneling for Flash EEPROM cell 810. This intermediate voltage will generally be in the range from 7 volts to 11 volts. In some cases, a voltage as high as VEE may be coupled to second control gate 855 in order to prevent electrons from tunneling; however, as this voltage on second control gate 855 becomes greater, a concern is that this voltage may disturb the states of other cells in an array of memory cells.

Figure 8D:
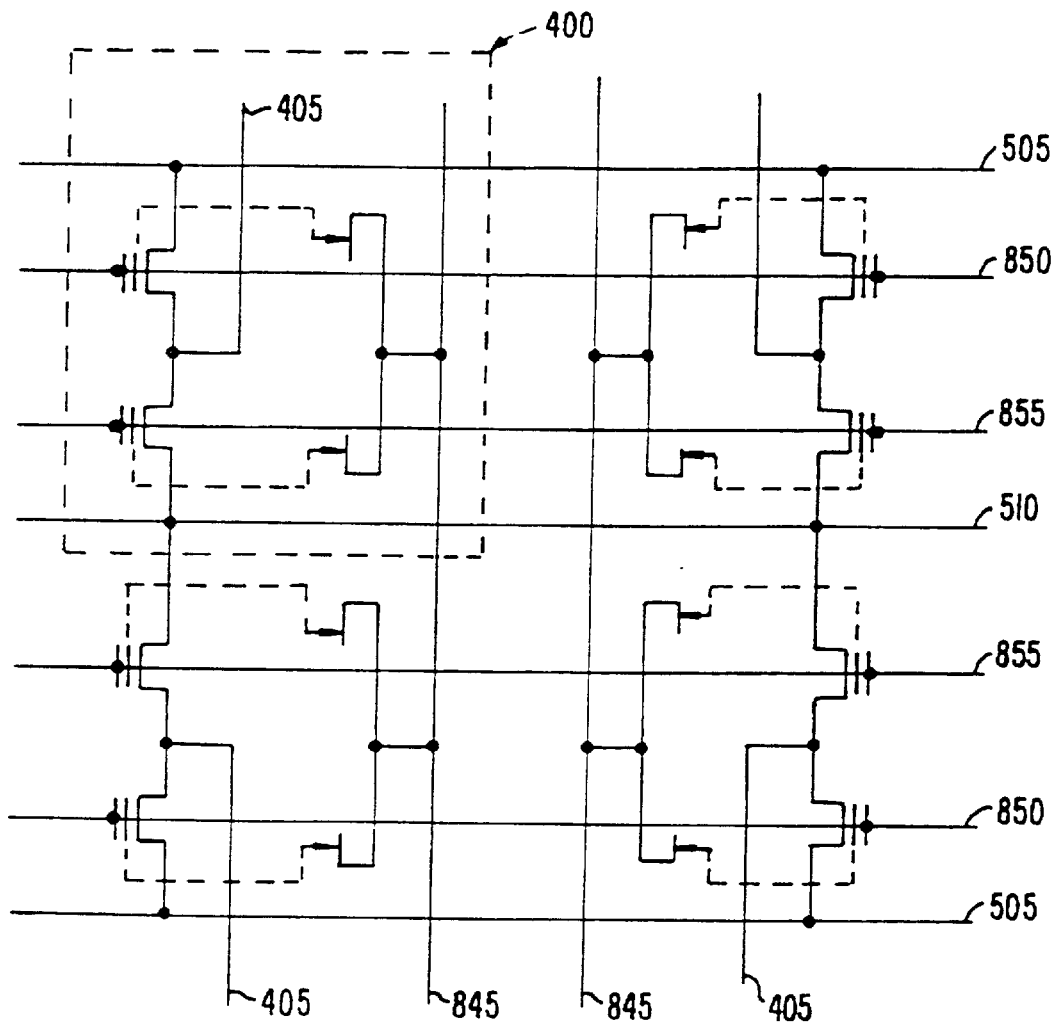
FIG. 8D is a simplified layout diagram of four cells of FIG. 8C.

FIG. 8D shows an array of memory cells 400 of FIG. 8C. Memory cells 400 are implemented using single- or double-polysilicon Flash EEPROM memory cells. FIG. 8D shows four memory cells 400 of FIG. 8C. However, larger arrays of memory cells 400 may be constructed by mirroring and exploiting the symmetry of memory cells 400, and other similar techniques.

FIG. 8D also shows how the layout of an array of memory cells 400 of FIG. 8C may be compacted to save integrated circuit area. There are a plurality of signals in a first direction and a plurality of signals in a second direction. In this embodiment, the signals in the first direction are substantially transverse to the signals in the second direction. In the first direction, the signals include first control gate 850 and second control gate 855. In the second direction, the signals include first voltage source 505, second voltage source 510, and erase node 845. Sensing node 405 may be a local connection which may be routed as needed to couple to the appropriate device or devices, or locations. These control signals are coupled to the corresponding nodes in the memory cell 400. Besides providing for an efficient layout of memory cells 400, the configuration of the signal lines shown in FIG. 8D also allows for the efficient routing of signals in the integrated circuit.

The control lines of the present invention are organized using a grid system. This routing of signals allows easier programming, erasing, and reading of memory cells 400. Memory cells 400 may be configured row by row, many bits at a time, until the array of memory cells 400 is configured. For example, in one embodiment, eight memory cells 400 may be configured at one time.

An array of memory cells 400 is a method of compactly arranging memory cells 400 on an integrated circuit. Although memory cells 400 may be laid out together on the integrated circuit, each memory cell 400 may drive logic and other components in many different locations on the integrated circuit.

Figure 9A:
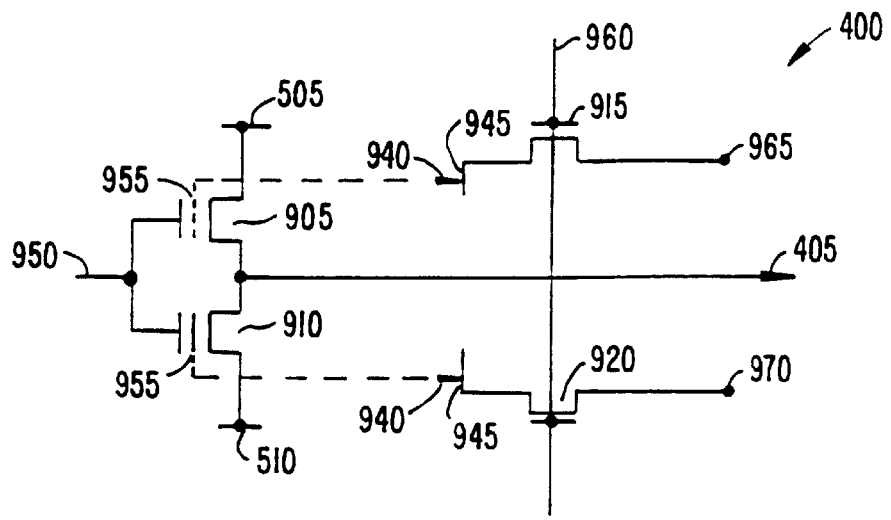
FIG. 9A shows a memory cell of the present invention implemented using EEPROM memory cells.

FIG. 9A shows memory cell 400 of the present invention implemented using single- or double-polysilicon EEPROM cells. In this embodiment, memory cell 400 includes the following devices: an EEPROM cell 905, an EEPROM cell 910, a first select transistor 915, and a second select transistor 920. Memory cell 400 has floating gates 955. Furthermore, memory cell 400 has tunnel dielectric 940 for transferring electrons to from EEPROM cell 905 and EEPROM cell 910. EEPROM cell 905 is coupled between first voltage source 505 and sensing node 405. EEPROM cell 910 is coupled between sensing node 405 and second voltage source 510. Select transistor 915 is coupled to floating gate 955 of EEPROM cell element 905 through a tunnel diode 945 and tunnel dielectric 940. Select transistor 920 is coupled to floating gate 955 of EEPROM cell 910 through a tunnel diode 945 and tunnel dielectric 940. A select gate 960 is coupled to the gates of select transistors 915 and 920.

EEPROM cell 905 and EEPROM cell 910 are configured to store the data of memory cell 400. Data from memory cell 400 is read or output from sensing node 405. As in the previous embodiments of the present invention, depending on the configured states of EEPROM cells 905 and EEPROM cell 910, sensing node 405 will represent a logic high or logic low.

EEPROM cell 905 and EEPROM cell 910 have two states, programmed and erased. In contrast to Flash EEPROM cells, when initialized, EEPROM cells are programmed to a high VT state. A typical VTP for EEPROM cells is about 4 volts to 5 volts. In a high VT state, an EEPROM cell decouples its drain terminal from its source terminal. When erased to a low VT state, an EEPROM cell couples its drain terminal to its source terminal. A typical VTE for EEPROM cells is about −2 volts. The smart algorithm described above may also be used to erase EEPROM cells to obtain a VTE of about zero volts.

By appropriately erasing an EEPROM cell, memory cell 400 will store a logic high or logic low. For example, in a first state, to store a logic high in memory cell 400, EEPROM cell 905 is erased, while EEPROM cell 910 remains programmed. Sensing node 405 will be approximately equal to the level of the first voltage source 505, representing a logic high. In a second state, to store a logic low, EEPROM cell 910 is erased, while EEPROM cell 905 remains programmed. Sensing node 405 will be approximately equal to the voltage level of second voltage source 515, representing a logic low.

A control gate 950 is coupled to the gates of EEPROM cell 905 and EEPROM cell 910. Control gate 950 is used to activate the EEPROM cells. Control gate 950 is similar to control signals 525 and 530 and first control gate 750 and second control gate 755 of FIG. 7A described above. However, in this embodiment, one control gate signal is shared by the two EEPROM cells. For normal operation of memory cell 400, control gate 950 is set at a voltage so that approximately full-rail voltage output is provided at sensing node 405. More specifically, as described earlier, during normal operation, control gate 950 is set at a voltage between the VTE and VTP of EEPROM cells 905 and 910 to maximize the amount of programming and erase margin. In one embodiment, this voltage is in the range from approximately 1.7 volts to 2 volts. Also, as discussed previously, although shown as single control gate 950, the gates of EEPROM cell 905 and EEPROM cell 910 may also be set at a different voltages from each other.

Select transistor 915 is used to program and erase EEPROM cell 905. Select transistor 920 is used to program and erase EEPROM cell 910. For example, to initialize EEPROM cells 905 and 910 to a high VT state, control gate 950 is set to VPP. Erase node 965 and erase node 970 are grounded. Select gate 960 is set at a voltage to turn on select transistors 915 and 920. Typically, select gate 960 is set at a voltage of about 2 volts, although any voltage in the range from 2 volts to VDD will also turn select transistors 915 and 920 on. First voltage source 505 and second voltage source 510 are grounded. Under these conditions, electrons will be attracted from tunnel diodes 945 through tunnel dielectric 940 into floating gates 955 of EEPROM cells 905 and 910. Floating gates 955 will become negatively charged, so that EEPROM cells 905 and 910 are in a high VT state.

Furthermore, VTP may be boosted to a higher value by using the assist programming technique described earlier. In assist programming, when programming EEPROM cells 905 and 910, first voltage source 505 and second voltage source 510 are set to VDD. Since control gate 950 is at VPP, sensing node 405 is also at about VDD. Under these conditions, more electrons become trapped in floating gate 955 than under the programming conditions described above. Hence, floating gate 955 is programmed to a higher VTP level.

Flash EEPROM cells may be programmed using hot electrons. In comparison, EEPROM cells are programmed using quantum-mechanical tunneling. To program using hot electrons, a large amount of current—about five hundred microamps—is needed per bit. This generally limits the number of bits that can be programmed at one time because of current density concerns. In contrast, by using quantum-mechanical tunneling, substantially less current is needed to program EEPROM cells. EEPROM cells are programmed primarily due to the magnitude of the high voltages. Since high currents are not necessary, the use of EEPROM cells provides integrated circuits which may be programmed while resident on a system board—in-system programming (ISP)—when large currents are unavailable. Also, some Flash EEPROM cells are programmed using quantum-mechanical tunneling. These Flash EEPROM cells may require sufficiently low currents that they may be used in ISP applications.

Quantum-mechanical tunneling is used to erase both EEPROM and Flash EEPROM cells. EEPROM cells are selectively erased. For example, to erase EEPROM cell 905, select gate 960 is set to VEE+VT (a threshold voltage of select transistor 915 and 920). Erase node 965 is coupled to VEE, while erase node 970 is grounded. Control gate 950 is held at a low voltage, grounded or negative. First voltage source 505 and second voltage source 510 are grounded. VEE is passed through select transistor 915 to tunnel diode 945. Electrons from floating gate 955 of EEPROM cell 905 are attracted through tunnel dielectric 940 into tunnel diode 945. This removes electrons from floating gate 955 of EEPROM cell 905. Thus, EEPROM 905 is erased to a low VT state. EEPROM cell 910 is erased similarly, by coupling erase node 970 to VEE and erase node 965 to ground.

Figure 9B:
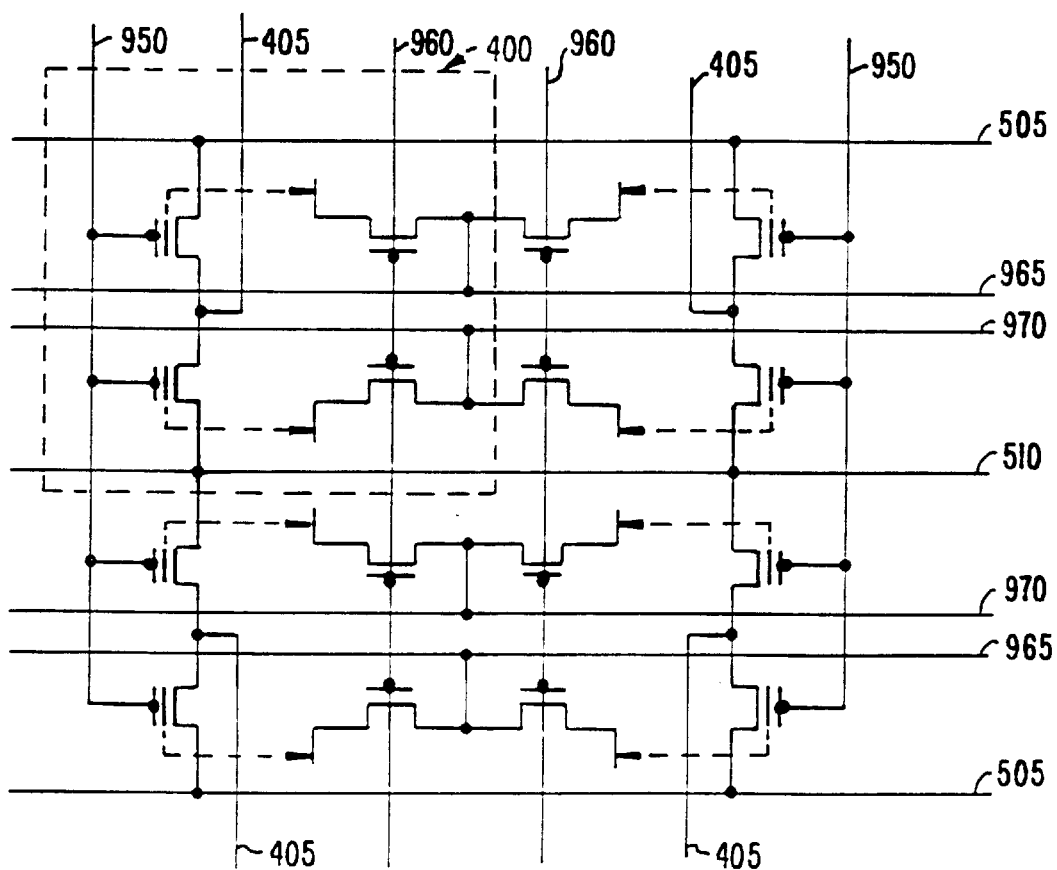
FIG. 9B shows a simplified layout diagram of four cells of FIG. 9A.

FIG. 9B shows an array of memory cells 400 of FIG. 9A. Memory cells 400 are implemented using EEPROM memory cells. FIG. 9B shows four memory cells 400 of FIG. 9A. However, larger arrays of memory cells 400 may be constructed by mirroring and exploiting the symmetry of memory cells 400, and other similar techniques.

FIG. 9B also shows how the layout of an array of memory cells 400 of FIG. 9A may be compacted to save integrated circuit area. There are a plurality of signals in a first direction and a plurality of signals in a second direction. In this embodiment, the signals in the first direction are substantially transverse to the signals in the second direction. In the first direction, the signals include first voltage source 505, erase node 965, erase node 970, and second voltage source 510. In the second direction, the signals include control gate 950, and select gate 960. Sensing node 405 may be a local connection which may be routed as needed to couple to the appropriate device or devices, or locations. These control signals are coupled to the corresponding nodes in the memory cell 400. This configuration of signals provides for efficient layout of memory cells 400. Furthermore, the arrangement of the signals facilitates the efficient routing of signals in the integrated circuit. Note that one control gate 950 signal line is shared among four EEPROM cells, which allows a more compact layout. Also, this permits initializing the EEPROM cells of FIG. 9B to a high VT state in a single operation. Besides providing for an efficient layout of memory cells 400, the configuration of the signal lines shown in FIG. 9B also allows for the efficient routing of signals in the integrated circuit.

Furthermore, there are many other possible configurations to form an array of memory cells of the present invention. In a preferred embodiment, select gate 960 should be layed out perpendicular to the direction of erase node 965 and erase node 970. However, as discussed above, the specific configuration depends on the process technology used. For example, select gate 960 may run in the first direction and, erase node 965 and erase node 970 may run in the second direction. This configuration would be an alternative to the one shown in FIG. 9B.

The control lines of the present invention are organized using a grid system. This routing of signals allows easier programming, erasing, and reading of memory cells 400. Memory cells 400 may be configured many bits at a time until the array of memory cells 400 is configured. More specifically, after providing VEE+VT at select gate 960 and grounding control gate 950, memory cells 400 may be configured by selectively providing VEE and ground on the appropriate erase nodes 965 and 970. This permits many memory cells 400 to be configured at the same time.

An array of memory cells 400 is a method of compactly arranging memory cells 400 on an integrated circuit. Although memory cells 400 may be laid out together on the integrated circuit, each memory cell 400 may drive logic and other components in many different locations on the integrated circuit.

Figure 10:
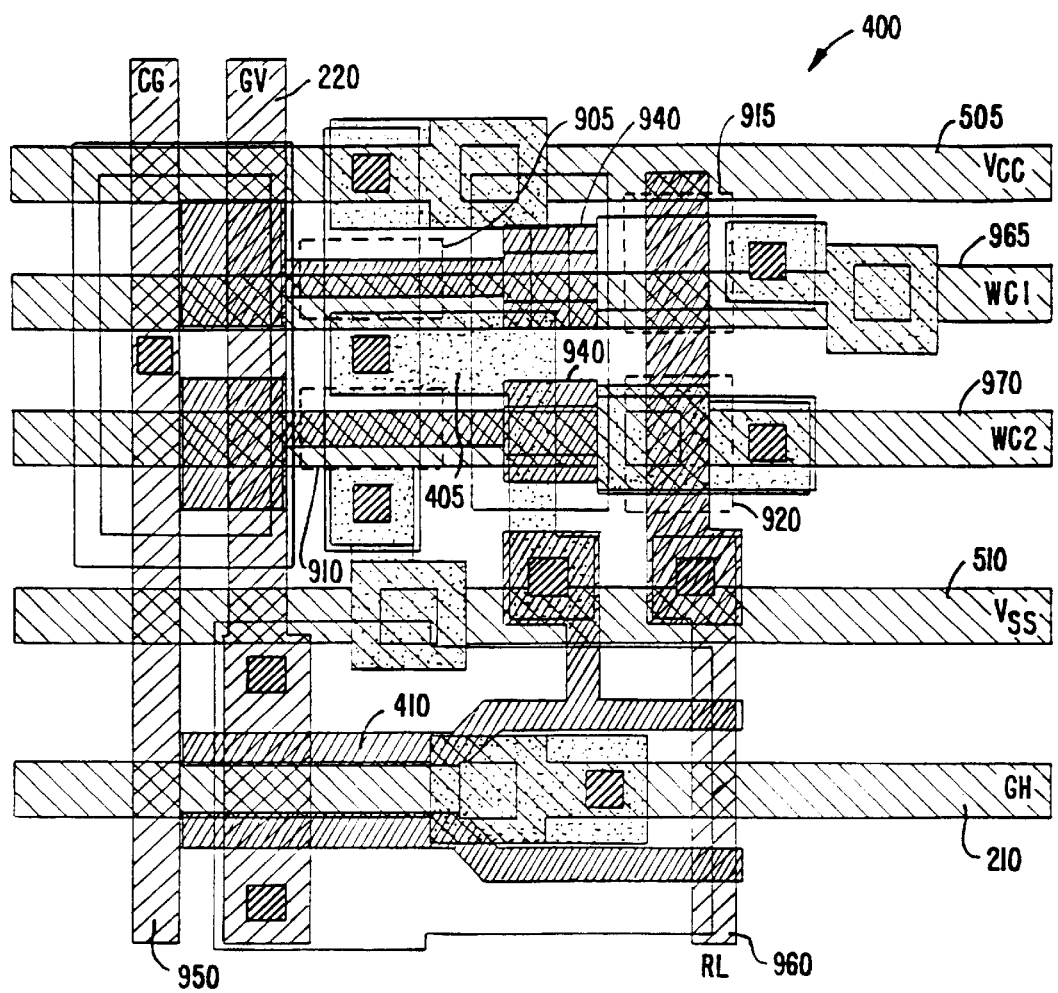
FIG. 10 shows a layout of the programmable interconnect of FIG. 4, implemented using the EEPROM memory cell configuration of FIG. 9A.

FIG. 10 shows a layout of an implementation of the programmable interconnect circuit of FIG. 4. In FIG. 10, memory cell 400 is implemented using EEPROM memory cells, as shown in FIG. 9A. Pass transistor 410 is coupled between GH 210 and GV 220. A polysilicon gate of pass transistor 410 is coupled to sensing node 405 of memory cell 400. Memory cell 400 is comprised of EEPROM cell 905, EEPROM cell 910, first select transistor 915, and second select transistor 920. The control signals controlling this memory cell are first voltage source 505, second voltage source 510, erase node 965, erase node 970, control gate 950, select gate 960. Select transistors are coupled to their respective EEPROM cells via tunnel window 940.

Figure 11:
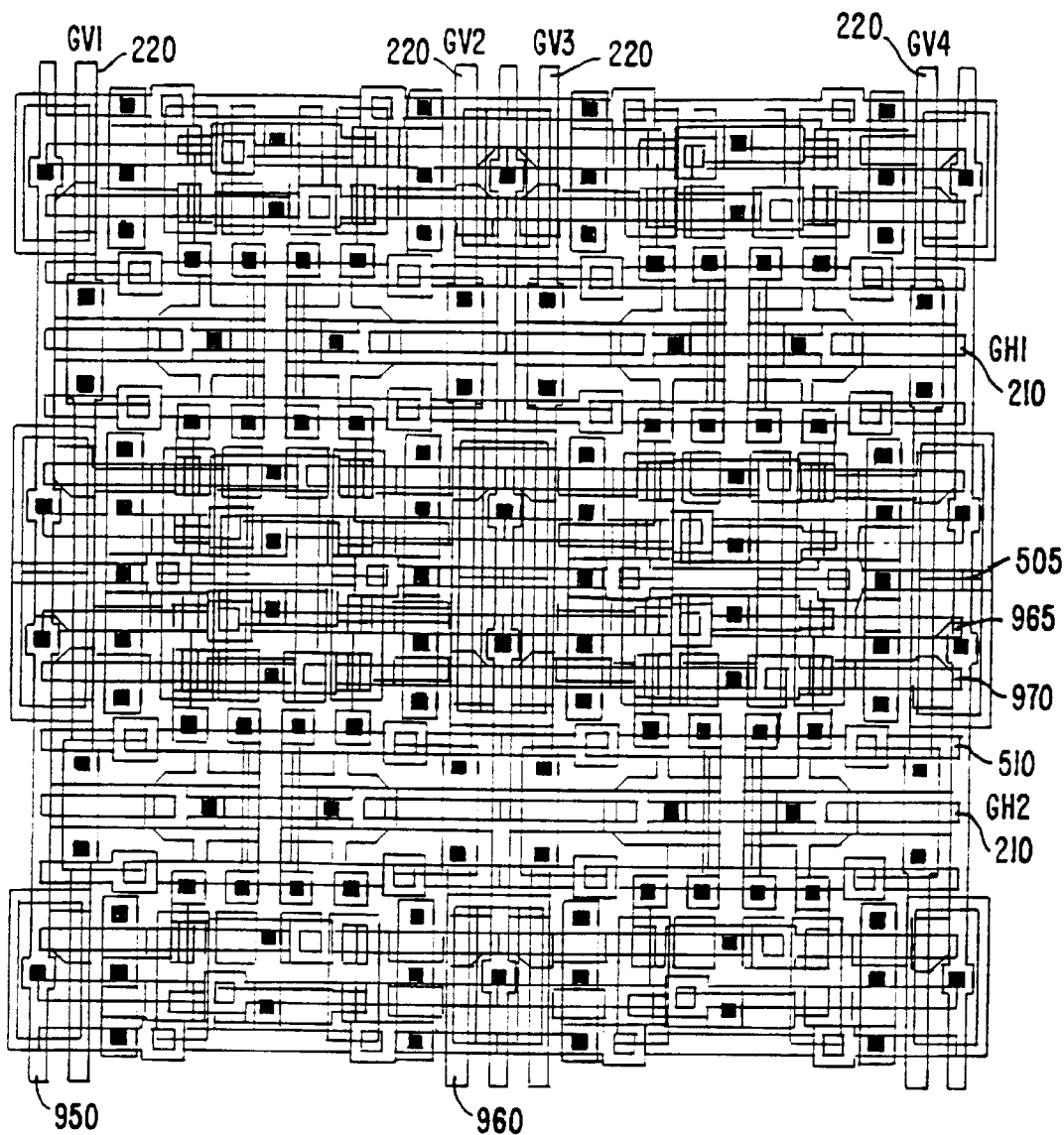
FIG. 11 shows a larger scale layout of FIG. 10, having a plurality of GH and GV lines and an array of programmable memory cells of FIG. 9A.

FIG. 11 shows a larger scale layout the layout of FIG. 10. In FIG. 11, there are a plurality of GHs 210 and GVs 220. More specifically, there are two GHs 210 and four GVs 220. Further, a plurality of memory cells 400 (of FIG. 9A) is repeated and coupled together to form an array of eight memory cells for programmably controlling the interconnections between GHs 210 and GVs 220.

The foregoing description of preferred embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. It is intended that the scope of the invention be defined by the claims appended hereto.

What is claimed is:

1. A memory cell for an integrated circuit comprising:
   a first voltage source;
   a second voltage source, the second voltage source at a voltage level below a voltage level of the first voltage source;
   a sensing node;
   a first programmable memory element, coupled between the first voltage source and the sensing node; and
   a second programmable memory element, coupled between the sensing node and a second voltage source, wherein the first programmable memory element and the second programmable memory element are independently programmable.

2. The memory cell of claim 1 wherein the first programmable memory element and the second programmable memory element have individual floating gates.

3. The memory cell of claim 1 wherein the first programmable memory element is a similar device type as the second programmable memory element.

4. The memory cell of claim 1 wherein the first programmable memory element is an EEPROM cell.

5. The memory cell of claim 4 wherein the first programmable memory element is a Flash memory cell.

6. The memory cell of claim 5 wherein the first programmable memory element is a one-transistor double polysilicon Flash EEPROM memory cell.

7. A memory device for an electronic circuit comprising:

a first source;

a second source, the second source at a level below a level of the first source;

a sensing node;

a first programmable memory, coupled between the first source and the sensing node; and a second programmable memory, coupled between the sensing node and a second source, wherein the second programmable memory is a similar type as the first programmable memory.

8. The memory device of claim 7 wherein the sensing node of the memory device in a first state is at a level about equal to the first source, and the output in a second state is at a level about equal to the second source.

9. The memory device of claim 7 wherein the first programmable memory and second programmable memory comprise NMOS device types.

10. The memory device of claim 9 wherein the first programmable memory and second programmable memory comprise floating gates.

11. The memory device of claim 7 wherein the second programmable memory turns on depending on a magnitude of a voltage between a gate of the second programmable memory and the second source, and the first programmable memory turns on depending on a magnitude of a voltage between a gate of the first programmable memory and the sensing node.

12. A memory cell for an integrated circuit comprising:

a first voltage conductor;

a second voltage conductor;

a sensing node;

a first programmable memory element, coupled between the first voltage conductor and the sensing node; and a second programmable memory element, coupled between the sensing node and a second voltage conductor, wherein the first programmable memory element is programmed independently of the second programmable memory element.

13. The memory cell of claim 12 wherein when determining a stored stated of the memory cell, the second voltage conductor is set at a voltage level below a voltage level at the first voltage conductor.

14. A memory cell comprising:

a first conductor;

a second conductor; and a first programmable memory and a second programmable memory coupled between the first conductor and the second conductor, wherein the first programmable memory is configurable in either a programmed state or an erased state when the second programmable memory is in the programmed state.

15. The memory cell of claim 14 wherein the first programmable memory comprises a first floating gate and the second programmable memory comprises a second floating gate.

16. A memory cell comprising:

a first conductor;

a second conductor; and a first programmable memory and a second programmable memory serially coupled between the first conductor and the second conductor, wherein the first and second programmable memories are programmable using only non-negative programming voltages.

17. A nonvolatile memory circuit comprising:

a first NMOS programmable memory coupled between a first source conductor and an output node, wherein the first NMOS programmable memory comprises a first floating gate; and a second NMOS programmable memory coupled between the output node and a second source, wherein the second NMOS programmable memory comprises a second floating gate, and to provide a first output state at the output node, the first NMOS programmable memory is configured in a programmed state and the second NMOS programmable memory is configured in an erased state, and to provide a second output state at the output node, the first NMOS programmable memory is configured in the erased state and the second programmable memory is configured in the programmed state.

18. The memory circuit of claim 17 wherein the first output state is representative of a logic zero, and the second output state is representative of a logic one.

19. The memory circuit of claim 17 wherein the first NMOS programmable memory further comprises a first control gate, and the second NMOS programmable memory further comprises a second control gate.

20. The memory circuit of claim 17 wherein the first and second NMOS programmable memories are EEPROM devices.

21. The memory circuit of claim 17 wherein the first and second NMOS programmable memories are Flash devices.

22. The memory circuit of claim 17 wherein the first and second NMOS programmable memories are electrically configured to the erased or programmed states.

23. The memory circuit of claim 17 wherein a voltage level at the output node for the first output state will be at about a voltage level of the first source or the second source.

* * * * *